United States Patent [19]

Tabata et al.

[11] Patent Number: 5,503,942
[45] Date of Patent: Apr. 2, 1996

[54] INORGANIC SKIN FILM

[75] Inventors: Masamune Tabata; Yoshikazu Fujisawa; Kenji Dosaka; Takahiro Gunji, all of Saitama, Japan

[73] Assignee: Honda Giken Kogyo Kabushiki Kaisha, Tokyo, Japan

[21] Appl. No.: 236,901

[22] Filed: Apr. 29, 1994

[30] Foreign Application Priority Data

Apr. 30, 1993 [JP] Japan .................................. 5-127834
Oct. 15, 1993 [JP] Japan .................................. 5-281874

[51] Int. Cl.$^6$ .......................... F16C 33/06; F16C 33/12; B32B 15/18
[52] U.S. Cl. ......................... 428/687; 428/653; 428/935; 277/236; 384/912
[58] Field of Search .................... 428/687, 935, 428/653, 680; 384/912, 913; 277/236, 235 A; 123/193.6

[56] References Cited

U.S. PATENT DOCUMENTS

| | | | |
|---|---|---|---|
| 4,746,412 | 5/1988 | Uchida et al. | 204/44.7 |
| 5,310,606 | 5/1994 | Fujisawa et al. | 428/687 |
| 5,320,703 | 6/1994 | Ikeda et al. | 117/687 |
| 5,322,742 | 6/1994 | Fujisawa et al. | 428/687 |
| 5,340,660 | 8/1994 | Fujisawa et al. | 428/687 |
| 5,342,698 | 8/1994 | Fujisawa et al. | 428/687 |
| 5,391,431 | 2/1995 | Kudoh et al. | 428/611 |

FOREIGN PATENT DOCUMENTS

| | | |
|---|---|---|
| 4101386 | 7/1991 | Germany. |
| 2240343 | 7/1991 | United Kingdom .......... 33/6 |
| 2256903 | 12/1992 | United Kingdom ........ 33/12 |
| 2256235 | 12/1992 | United Kingdom ........ 33/12 |
| 2257759 | 1/1993 | United Kingdom. |

OTHER PUBLICATIONS

R. Fratesi, G. Roventi, "Electrodeposition of Lead Alloys from Fluoborate Baths", Journal of Applied Electrochemistry 14 (1984), No Month, pp. 505–510.
UK Examiner's Report dated 14 Jul. 1994.
German article entitled "Einführung in die Kristallographic" by Will Kleber, cover page and pp. 72–73 (with translation of p. 73, 2nd paragraph, and Table 1.3) No Date.

Primary Examiner—John Zimmerman
Attorney, Agent, or Firm—Lyon & Lyon

[57] ABSTRACT

A slide surface construction which is an inorganic skin film formed of an aggregate of Fe crystals having a body-centered cubic structure. The aggregate includes a large number of {222} oriented Fe crystals with their {222} planes (by Miller indices) oriented toward a slide surface. At least some of these {222} oriented Fe crystals are hexangular pyramid-shaped Fe crystals having six ridge lines. These Fe crystals having six ridge lines ensure that the oil retention of the slide surface construction can be improved, and a slide load acting on the slide surface can be finely divided.

9 Claims, 35 Drawing Sheets

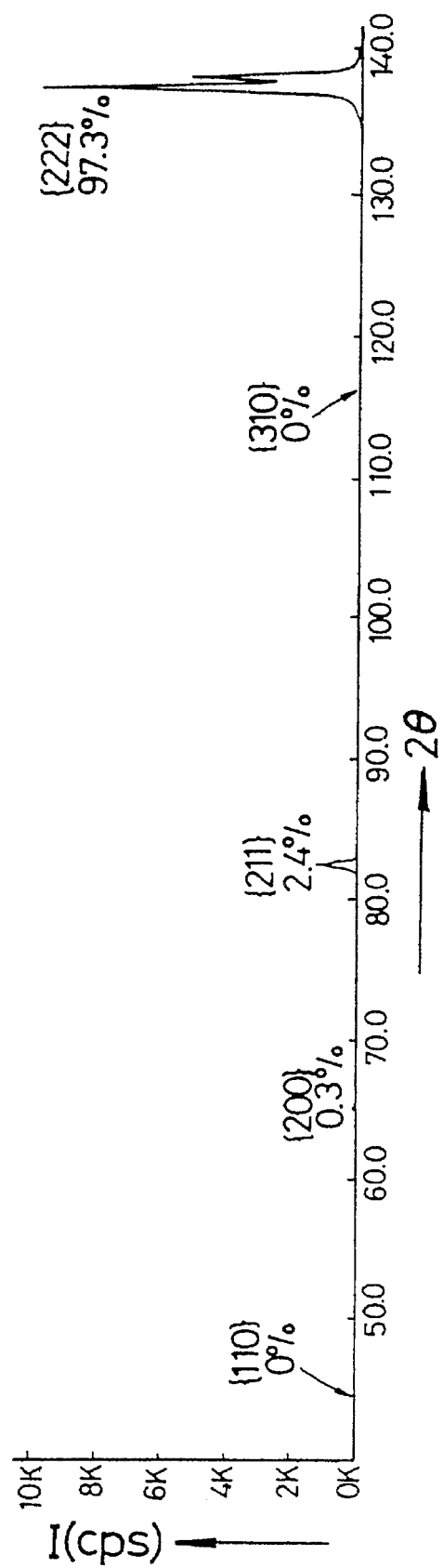

10μm

5μm

10μm

5μm

10μm

5μm

1μm

10μm

5μm fcc structure (3hhh) plane fcc structure (3hhh) plane

INORGANIC SKIN FILM

BACKGROUND OF THE INVENTION

1. Field of the Invention

The present invention relates to an inorganic skin film and, in particular, to an inorganic skin film formed of an aggregate of crystals and having at least one of a large number of pyramid-shaped metal crystals and a large number of truncated pyramid-shaped metal crystals in a surface thereof, and to a process for forming such inorganic skin film.

2. Description of the Prior Art

One example of such conventionally known inorganic skin films is an Fe-plated layer which is provided on outer peripheral surfaces of a land portion and a skirt portion of a base material of aluminum alloy, for example, of a piston for an internal combustion engine in order to provide an improved wear resistance.

However, under existing circumstances where a high speed and a high output of the internal combustion engine are desired, the prior art Fe-plated layer suffers from problems of insufficient oil-retaining property, i.e., oil retention, and poor initial conformability and thus a poor seizure resistance because the slide surface thereof is relatively smooth.

SUMMARY OF THE INVENTION

It is an object of the present invention to provide an inorganic skin film of the type described above, and a process for forming the same, which can meet the above demand.

To achieve the above object, according to the present invention, there is provided an inorganic skin film formed of an aggregate of crystals having a cubic crystal structure, at least some of these crystals being hexangular pyramid-shaped or truncated hexangular pyramid-shaped crystals having six ridge lines in a surface of the skin film.

The hexangular pyramid-shaped or truncated hexangular pyramid-shaped crystals, i.e., crystals having six ridge lines, are small in average grain size and substantially uniform in grain size, as compared with triangular pyramid-shaped or truncated triangular pyramid-shaped crystals, i.e., crystals having three ridge lines. In the crystals having six ridge lines, there is a correlation between the grain size and the height. Thus, the grain size is substantially uniform, which indicates that the height is also substantially equal. Moreover, two adjacent metal crystals having six ridge lines assume mutually biting states.

For example, if the inorganic skin film of metal crystals having six ridge lines is used as a slide surface construction, the slide surface thereof has an enlarged surface area, as compared with the case where the slide surface is formed of crystals having three ridge lines. In addition, the slide surface takes on a very intricate morphology having a large number of extremely fine crests, a large number of extremely fine valleys defined between the crests, and a large number of extremely fine swamps defined due to the mutual biting of the crests, and hence, the slide surface construction has an extremely good oil retention. The slide surface construction also has an enhanced initial conformability by preferential wearing of tip ends of the crystals having six ridge lines.

Further, by finely dividing the crystals having six ridge lines uniformly, a local increase in surface pressure can be avoided, and a fine division of a slide load can be achieved. Thus, the slide surface construction exhibits an excellent wear resistance not only with lubrication but also without lubrication.

In addition, according to the present invention, there is provided a process for forming an inorganic skin film by plating, the inorganic skin film being formed of an aggregate of crystals and including at least one of a large number of pyramid-shaped crystals and a large number of truncated pyramid-shaped crystals in a surface of the skin film, the process having the steps of: controlling the output of a plating energy source to produce a pulse waveform such that the output is increased from a minimum value to reach a maximum value and then is reduced to the minimum value; and setting a ratio $T_{ON}/T_C$ of an output time $T_{ON}$ to a cycle time $T_C$ into a range of $T_{ON}/T_C \leq 0.45$, wherein the output time $T_{ON}$ is from the starting point of increasing the output to a starting point of reducing the output, and the cycle time $T_C$ is a time required for one cycle which is from an output increasing start point to a next output increasing start point of the output.

If the output of the plating energy source is controlled in the above manner and the ratio $T_{ON}/T_C$ of the output time to the cycle time is set in the above manner, it is possible to form, on a surface, an inorganic skin film including a large number of pyramid-shaped crystals which are finely divided uniformly. In addition, it is possible to set the content S of the pyramid-shaped crystals and/or the like in the surface in a range $S \geq 40\%$.

As a result, for example, in a piston having an inorganic skin film of the type described above, the inorganic skin film exhibits an excellent slide characteristic with lubrication. If the content S is set in a range $S \geq 90\%$, it is possible to enhance the slide characteristic of the inorganic skin film even without lubrication.

However, if the ratio $T_{ON}/T_C$ of the output time to the cycle time is larger than 0.45, the content S of the pyramid-shaped crystals and the like is less than 40%, and the benefits of providing the crystals is lost.

The above and other objects, features and advantages of the invention will become apparent from the following detailed description of preferred embodiments, taken in conjunction with the accompanying drawings.

BRIEF DESCRIPTION OF THE DRAWINGS

FIG. 7 is an X-ray diffraction pattern for the slide surface construction;

DESCRIPTION OF THE PREFERRED EMBODIMENTS

FIRST EMBODIMENT

Figure 1:
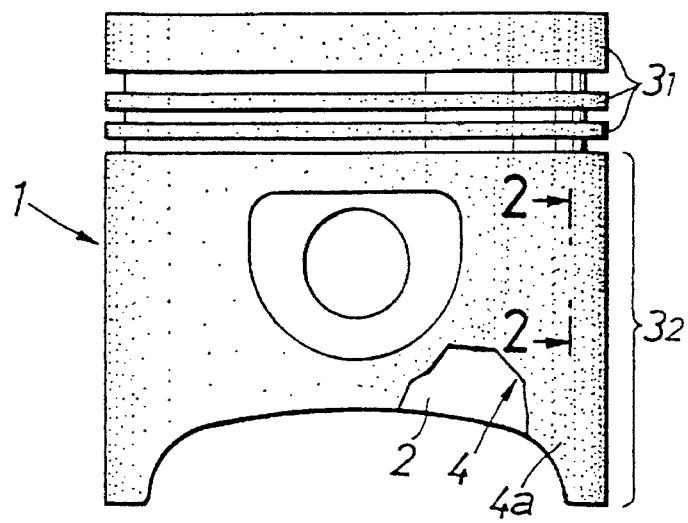
FIG. 1 is a side view of a piston.
Figure 2:
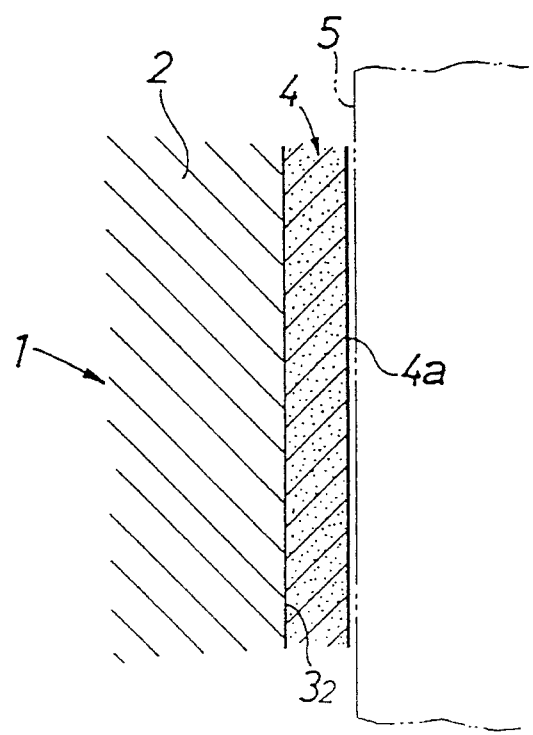
FIG. 2 is an enlarged sectional view taken along line 2—2 in FIG. 1.

Referring to FIGS. 1 and 2, a piston 1 for an internal combustion engine includes a base material 2 of an aluminum alloy, and a stratified slide surface construction (inorganic skin film) 4 formed on an outer peripheral surface of each land portion $3_1$ and a skirt portion $3^2$ of the base material 2 by plating.

Figure 3:
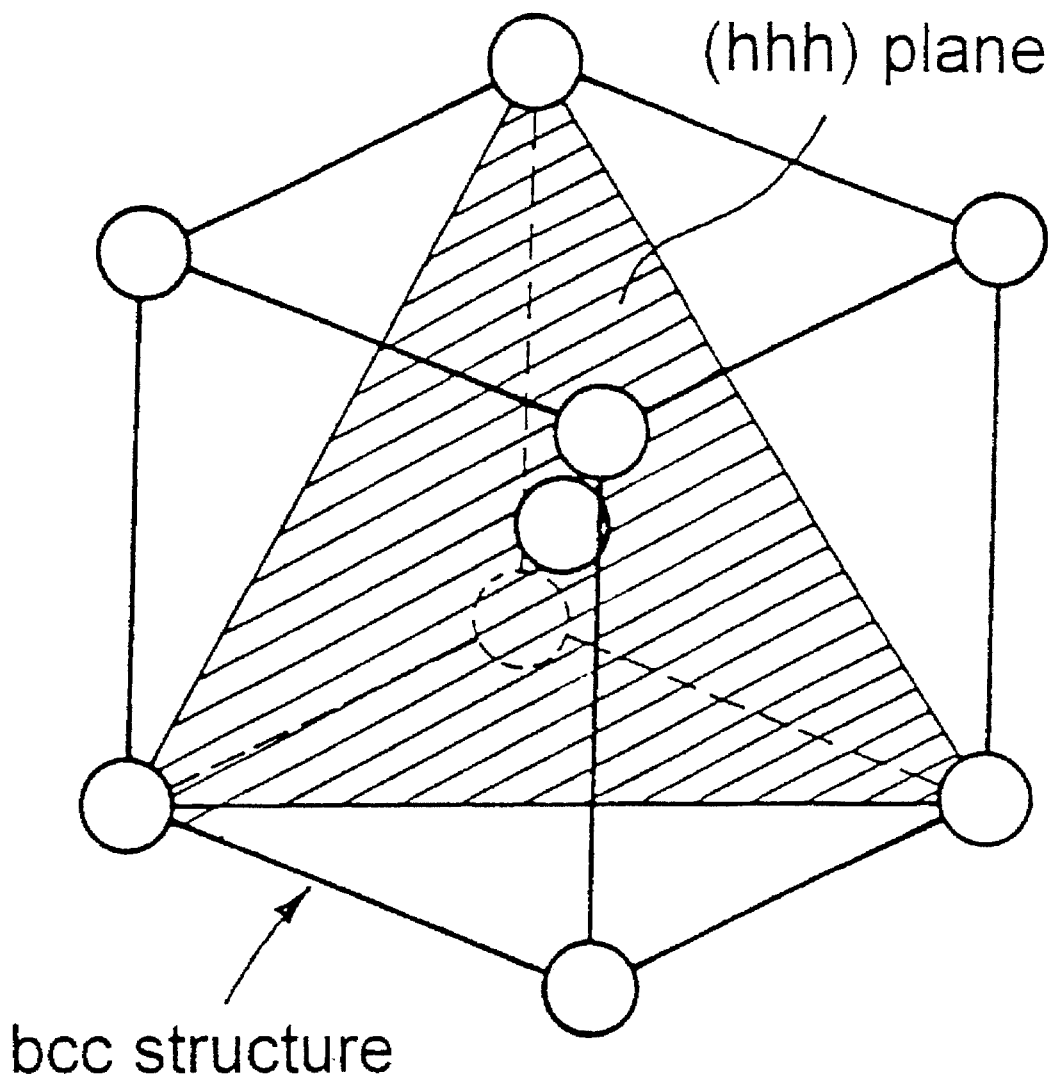
FIG. 3 is a perspective view illustrating a body-centered cubic structure and its (hhh) plane.

As shown in FIG. 3, the slide surface construction 4 is formed of an aggregate of metal crystals having a cubic crystal structure, e.g., a body-centered cubic structure (which will be referred to as a bcc structure hereinafter) in this embodiment. The aggregate includes a large number of (hhh) oriented metal crystals grown from the base material into a columnar form with their (hhh) planes (by Miller indices) oriented toward a slide surface (skin film surface) 4a for sliding on an inner wall 5 of a cylinder bore.

Figure 4A:
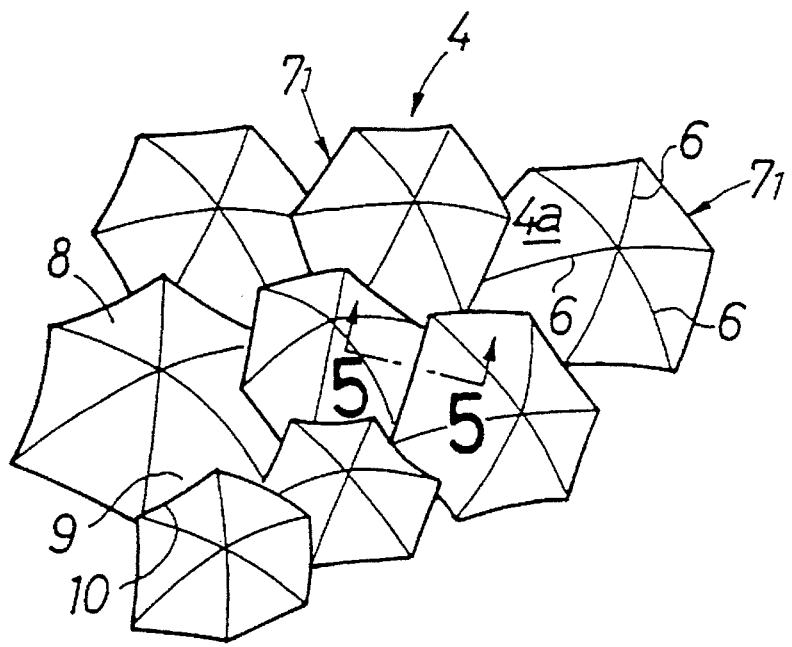
FIG. 4A is a diagrammatic plan view of a portion of one example of a slide surface construction of this invention.
Figure 4B:
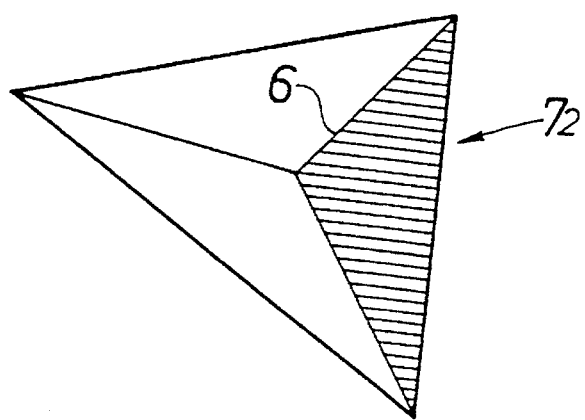
FIG. 4B is a plan view of a metal crystal having three ridge lines.

When the aggregate of the metal crystals having the bcc structure includes the large number of (hhh) oriented metal crystals with their (hhh) planes (by Miller indices) oriented toward the slide surface 4a, as described above, at least some of the (hhh) oriented metal crystals can be formed into hexangular pyramid-shaped (or truncated hexangular pyramid-shaped) metal crystals in the slide surface 4a, i.e., metal crystals $7_1$ each having six ridge lines 6, as shown in FIG. 4A. The metal crystals $7_1$ having six ridge lines 6 are small in average grain size and substantially uniform in grain size, as compared with a triangular pyramid-shaped (or triangular truncated pyramid-shaped) (hhh) oriented metal crystal shown in FIG. 4B, i.e., metal crystals $7_2$ having three ridge lines 6. There is a correlation between the grain size and the height of the (hhh) oriented metal crystals. Therefore, the substantial uniformity of the grain size means that the height is substantially equal.

Figure 5:
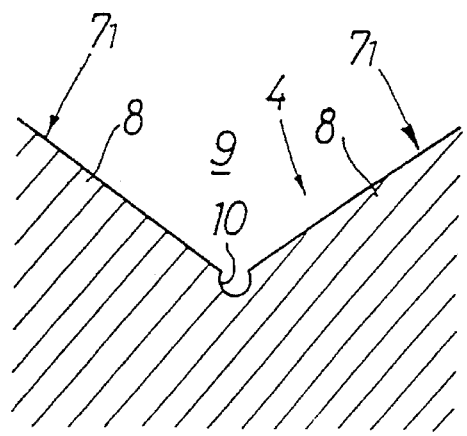
FIG. 5 is an enlarged sectional view taken along line 5—5 in FIG. 4A.

Moreover, two adjacent metal crystals $7_1$ having six ridge lines 6 are in a mutually biting relation. Thus, the slide surface 4a has an enlarged surface area as compared with the case where the slide surface is formed of crystals having three ridge lines, and takes on an intricate morphology having a large number of extremely fine crest portions 8, a large number of extremely fine valley portions 9 provided between the crest portions 8, and a large number of extremely fine swamps 10 (see FIG. 5) provided by mutual biting of the crest portions 8. This leads to extremely good oil retention of the slide surface construction 4. In addition, the tip end of each metal crystal $7_1$ having six ridge lines 6 will be worn preferentially, thereby providing an improved initial conformability of the slide surface construction 4.

Further, by finely dividing the metal crystals $7_1$ having six ridge lines 6 uniformly, a local increase in surface pressure can be avoided, and the slide load can be finely divided. Thus, the slide surface construction 4 exhibits an excellent wear resistance not only with lubrication but also without lubrication.

Figure 6:
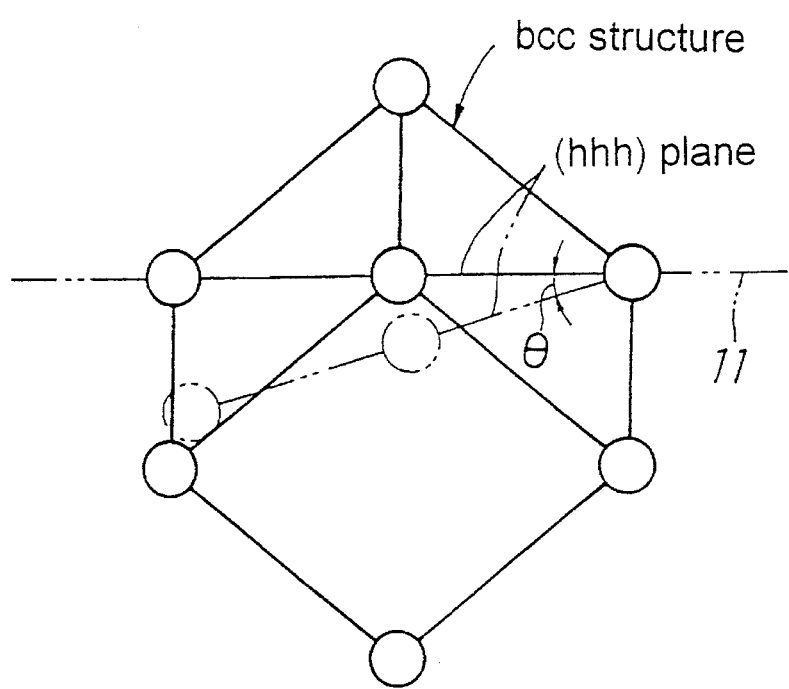
FIG. 6 is a diagram illustrating an inclination of the (hhh) plane in a body-centered cubic structure.

As shown in FIG. 6, an inclination of the (hhh) plane with respect to a phantom plane 11 along the slide surface 4a causes an inclination of the metal crystal $7_1$ having six ridge lines 6 which influences the oil retention, the initial conformability and the wear resistance characteristics of the slide surface construction 4. It is preferred that inclination angle θ formed by the (hhh) plane with respect to the phantom plane 11 is in a range of $0°≦θ≦15°$. The direction of the inclination of the (hhh) plane is not limited. If the inclination angle θ is larger than 15°, the oil retention, initial conformability and wear resistance characteristics of the slide surface construction 4 are adversely effected.

The metal crystals having the bcc structure include those of simple metals such as Fe, Cr, Mo, W, Ta, Zr, Nb, V, etc., and alloys thereof.

In the plating treatment for forming the slide surface construction 4, the basic compositions and conditions for electrolytic Fe-plating are as given in Tables 1 and 2.

TABLE 1

| Plating bath composition (g/liter) | | | |
|---|---|---|---|
| Ferrous sulfate | Boric acid | Ammonium sulfate | Organic additive(s) |
| 100–400 | 0–50 | 0–200 | 0–150 |

The organic additives used are urea, saccharin, etc.

TABLE 2

| Treating conditions | | |
|---|---|---|
| Plating bath pH | Plating bath temperature (°C.) | Cathode current density (A/dm²) |
| 3–6.5 | 10–60 | 0.1–10 |

A direct current or pulse current energization may be applied. If the area rate A of the metal crystals $7_1$ having six ridge lines 6 in the slide surface 4a is to be in a range of $A≧60\%$ under application of the pulse current energization, the average current density CDm in a cathode is set in a range represented by $1 A/dm^2 ≧ CDm ≦ 10 A/dm^2$, and a ratio $T_{ON}/T_C$ of output time $T_{ON}$ to cycle time $T_C$ is set in a range represented by $T_{ON}/T_C ≦ 0.45$, as described hereinafter.

In the electrolytic deposition of the Fe-plating treatment under the above-described conditions, the precipitation and content of the (hhh) oriented Fe crystals are controlled by the cathode current density or the average current density CDm, the pH of a plating bath and the like.

In addition to the electrolytic plating processes, examples of other plating treatments that may be used are PVD processes, CVD processes, sputtering processes, ion plating and the like, which are gas-phase plating processes. Conditions for W-plating or Mo-plating by sputtering include, for example, an argon pressure of 0.2 to 1 Pa, an average argon acceleration power of DC 1 to 1.5 kW, and a temperature of the base material of 150° to 300° C. Conditions for W-plating by a CVD process include, for example, a WF6 starting material, a gas flow rate of 2 to 15 cc/min., a pressure of 50 to 300 Pa within a chamber, a temperature of the base material of 400° to 600° C., and an average output power of ArF excimer laser of 5 to 40 W.

Particular examples will be described below.

A plurality of pistons 1 for internal combustion engines were produced by subjecting the outer peripheral surfaces of the land portions $3_1$ and the skirt portion $3_2$ of a base material 2 of an aluminum alloy to an electrolytic Fe-plating to form a slide surface construction 4 having an aggregate of Fe crystals.

Tables 3 and 4 show conditions for the electrolytic Fe-plating in examples 1 to 16 of pistons 1 with the slide surface constructions 4. The plating time was varied in a range of 10 to 60 minutes, so that the thickness in the examples 1 to 16 was set at 15 μm. In Table 4, the term "DC" means the utilization of a direct current energization process. The same is true in subsequent Tables.

TABLE 3

| Example No. | Plating bath composition (g/liter) | | | | |
|---|---|---|---|---|---|
| | Ferrous sulfate | Boric acid | Ammonium sulfate | Urea | Saccharin |
| 1 | 400 | 0 | 0 | 0 | 0 |
| 2 | 400 | 0 | 0 | 0 | 0 |
| 3 | 400 | 0 | 0 | 0 | 0 |
| 4 | 400 | 0 | 0 | 0 | 0 |
| 5 | 400 | 0 | 0 | 0 | 0 |
| 6 | 300 | 0 | 0 | 0 | 0 |
| 7 | 230 | 30 | 100 | 100 | 1 |
| 8 | 230 | 30 | 100 | 100 | 1 |
| 9 | 400 | 0 | 0 | 0 | 0 |
| 10 | 400 | 0 | 0 | 0 | 0 |
| 11 | 200 | 0 | 0 | 0 | 0 |
| 12 | 400 | 0 | 0 | 0 | 0 |
| 13 | 400 | 0 | 0 | 0 | 0 |
| 14 | 200 | 0 | 0 | 0 | 0 |
| 15 | 230 | 30 | 100 | 100 | 0.4 |
| 16 | 230 | 30 | 100 | 100 | 0.4 |

TABLE 4

| Example No. | Treating conditions | | |
|---|---|---|---|
| | Plating bath pH | Temperature of plating bath (°C.) | Cathode current density (A/dm²) |
| 1 | 6 | 50 | 4 |
| 2 | 5.7 | 50 | 4 |
| 3 | 5.5 | 50 | 4 |
| 4 | 5 | 50 | 4 |
| 5 | 4.5 | 50 | 4 |
| 6 | 6 | 50 | 4 |
| 7 | 6 | 50 | DC 0.2 |
| 8 | 6 | 50 | DC 1 |
| 9 | 6 | 50 | 3.5 |
| 10 | 5.5 | 50 | 3.5 |
| 11 | 6 | 50 | 3.5 |
| 12 | 6 | 50 | 7 |
| 13 | 5.5 | 50 | 7 |
| 14 | 6 | 50 | 7 |
| 15 | 4 | 50 | DC 5 |
| 16 | 2.7 | 50 | DC 7 |

Table 5 shows the crystal shape of the slide surface 4a, the area rate A and the average grain size d of the Fe crystals having six ridge lines, the content S of the oriented Fe crystals and the hardness of the oriented Fe crystals.

TABLE 5

| Example No. | Crystal shape of slide surface | Fe crystals having six ridge lines | | Content S (%) of oriented Fe cyrstals | | | | | Hardness (Hv) |
|---|---|---|---|---|---|---|---|---|---|
| | | Area rate A (%) | Average grain size d (μm) | {110} | {200} | {211} | {310} | {222} | |
| 1 | Hexagonal pyramid | 99 | 3 | 0 | 0.3 | 2.4 | 0 | 97.3 | 380 |
| 2 | Hexagonal pyramid | 96 | 3 | 0 | 0 | 4.8 | 0 | 95.2 | 370 |
| 3 | Hexagonal pyramid | 90 | 3 | 0 | 0 | 9.9 | 0 | 90.1 | 365 |
| 4 | Hexagonal pyramid Trigonal pyramid | 87 | 3 | 0.5 | 0.2 | 13.9 | 0 | 85.4 | 348 |
| 5 | Hexagonal pyramid Trigonal pyramid | 70 | 3 | 0.6 | 3.2 | 17.9 | 1.6 | 76.7 | 336 |
| 6 | Hexagonal pyramid Trigonal pyramid | 60 | 3 | 5.5 | 0.4 | 28.5 | 0.4 | 65.2 | 331 |
| 7 | Hexagonal pyramid Trigonal pyramid | 30 | 3 | 16.3 | 1.6 | 29.4 | 2.3 | 50.4 | 328 |
| 8 | Trigonal pyramid | 0 | — | 32.8 | 1.2 | 20.8 | 2.2 | 43 | 302 |
| 9 | Hexagonal pyramid | 99 | 2 | 0 | 0.2 | 1.2 | 0 | 98.6 | 390 |
| 10 | Hexagonal pyramid | 90 | 2 | 0 | 0.3 | 8.7 | 0 | 91 | 370 |
| 11 | Hexagonal pyramid Trigonal pyramid | 60 | 2 | 9.1 | 3.6 | 28.3 | 1.6 | 57.3 | 340 |
| 12 | Hexagonal pyramid | 98 | 5 | 0 | 0 | 2.9 | 0 | 97.1 | 375 |
| 13 | Hexagonal pyramid | 90 | 5 | 0 | 0.5 | 9.2 | 0 | 90.3 | 360 |
| 14 | Hexagonal pyramid Trigonal pyramid | 50 | 5 | 11 | 1.9 | 31.7 | 1.3 | 54.1 | 335 |
| 15 | Fine grain pyramid in part | — | — | 15 | 27 | 15 | 13 | 30 | 290 |
| 16 | Fine grain | — | — | 16 | 34 | 10 | 19 | 21 | 280 |

The area rate A of the Fe crystals having six ridge lines was determined according to A=(C/B)×100 (%), wherein B represents an area of the slide surface 4a, and C represents an area occupied by all the Fe crystals having six ridge lines in the slide surface 4a. The grain size of the Fe crystals having six ridge lines is an average value of distances between the mutually opposed corners on the opposite sides of an apex, i.e., three distances.

The content S was determined in the following manner on the basis of X-ray diffraction pattern (X-ray was applied in a direction perpendicular to the slide surface 4a) for the examples 1 to 15. By way of one example, the properties of Example No. 1 will be described in detail. FIG. 7 is an X-ray diffraction pattern for the example 1. The content S of the oriented Fe crystals was determined from the following expressions. It should be noted that, for example, the term "{110} oriented Fe crystal" means an oriented Fe crystal with its {110} plane oriented toward the slide surface 4a.

{110} oriented Fe crystals: $S_{110}=((I_{110}/IA_{110})/T)\times100$
{200} oriented Fe crystals: $S_{200}=((I_{200}/IA_{200})/T)\times100$
{211} oriented Fe crystals: $S_{211}=((I_{211}/IA_{211})/T)\times100$
{310} oriented Fe crystals: $S_{310}=((I_{310}/IA_{310})/T)\times100$
{222} oriented Fe crystals: $S_{310}=((I_{222}/IA_{222})/T)\times100$ wherein each of $I_{110}$, $I_{200}$, $I_{211}$, $I_{310}$ and $I_{222}$ is a measurement (cps) of intensity of X-ray reflected from each crystal plane, and each of $IA_{110}$, $IA_{200}$, $IA_{211}$, $IA_{310}$ and $IA_{222}$ is an intensity ratio of X-ray reflected from each crystal plane in an ASTM card, i.e., $IA_{110}=100$, $IA_{200}=20$, $IA_{211}=30$, $IA_{310}=12$ and $IA_{222}=6$. Further, $T=(I_{110}/IA_{110})+(I_{200}/IA_{200})+(I_{211}/IA_{211})+(I_{310}/IA_{310})+(I_{222}/IA_{222})$.

Figure 8A:
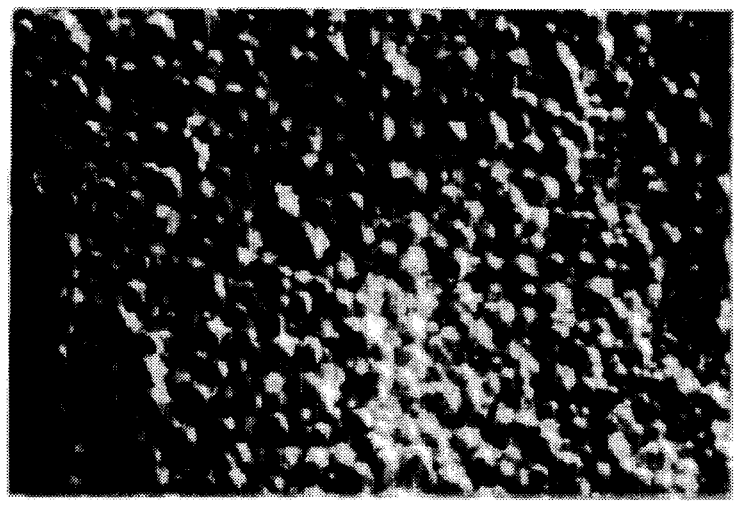
FIG. 8A is a photomicrograph showing a crystal structure of a slide surface of the slide surface construction.
Figure 8B:
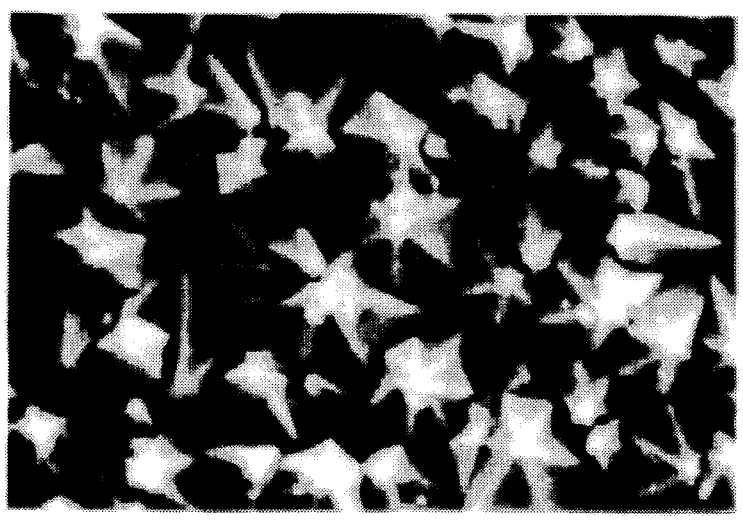
FIG. 8B is an enlarged photomicrograph of FIG. 8A.

FIGS. 8A and 8B are photomicrographs showing a crystal structure of the slide surface 4a in the example 1 (at different magnifications). In FIGS. 8A and 8B, a large number of Fe crystals having six ridge lines of a hexangular pyramid shape are observed. As shown in Table 5, the area rate A of the Fe crystals having six ridge lines is 99%, and the average grain size d thereof is 3 μm. This Fe crystal having six ridge lines is a {222} oriented Fe crystal with its (hhh) plane, i.e., {222} plane oriented toward the slide surface 4a. In this case, the content S of the {222} oriented Fe crystals is 97.3%.

Figure 9:
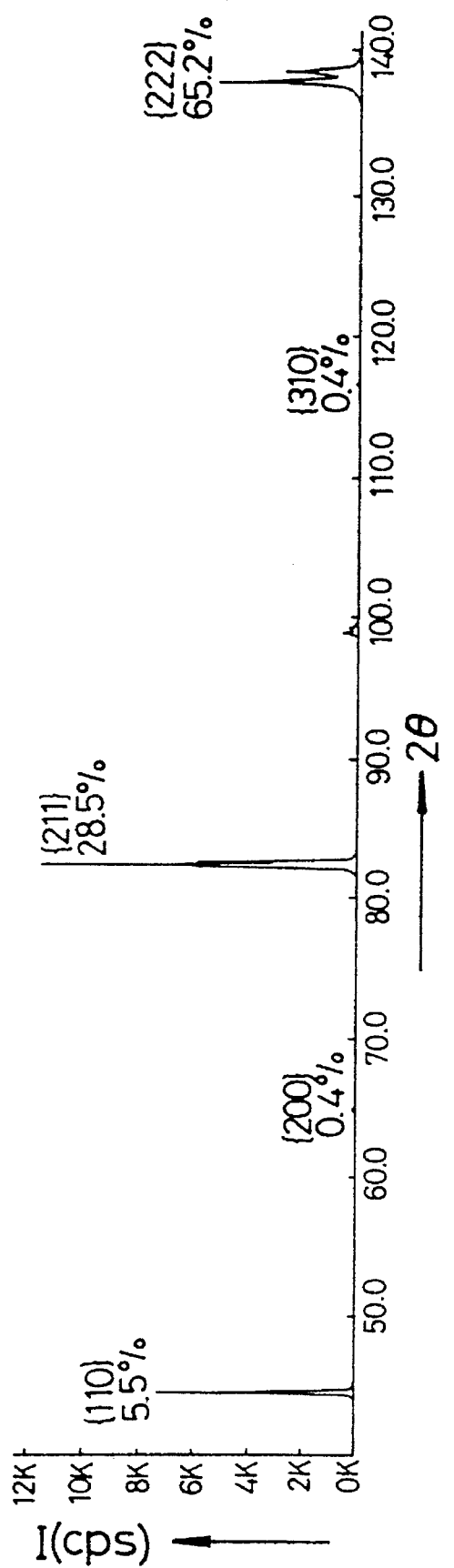
FIG. 9 is an X-ray diffraction pattern for a slide surface construction.
Figure 10A:
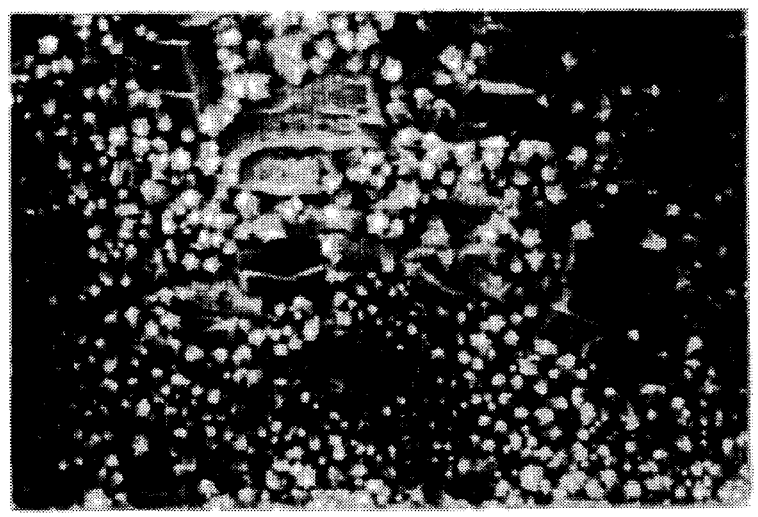
FIG. 10A is a photomicrograph showing a crystal structure of a slide surface of the slide surface construction.
Figure 10B:
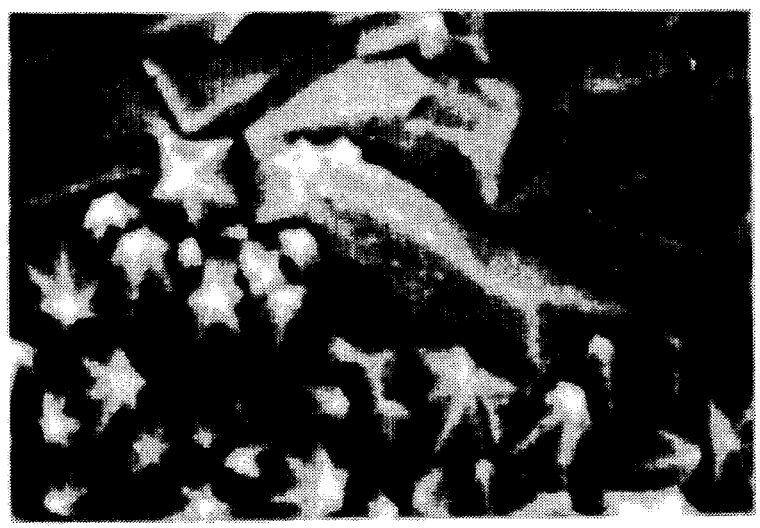
FIG. 10B is an enlarged photomicrograph of FIG. 10A.

FIG. 9 is an X-ray diffraction pattern of the Example No. 6. FIGS. 10A and 10B are photomicrographs showing a crystal structure of the slide surface 4a in the Example No. 6 (at different magnifications). In FIGS. 10A and 10B, a large number of Fe crystals having six ridge lines and a large number of Fe crystals having three ridge lines are observed. As shown in Table 5, the area rate A of the Fe crystals having six ridge lines is 60%, and the average grain size d thereof is 3 μm. In this case, the content S of the {222} oriented Fe crystals is 65.2%., as shown in Table 5 and FIG. 9. This content S is a value including Fe crystals having six ridge lines and three ridge lines.

Figure 11:
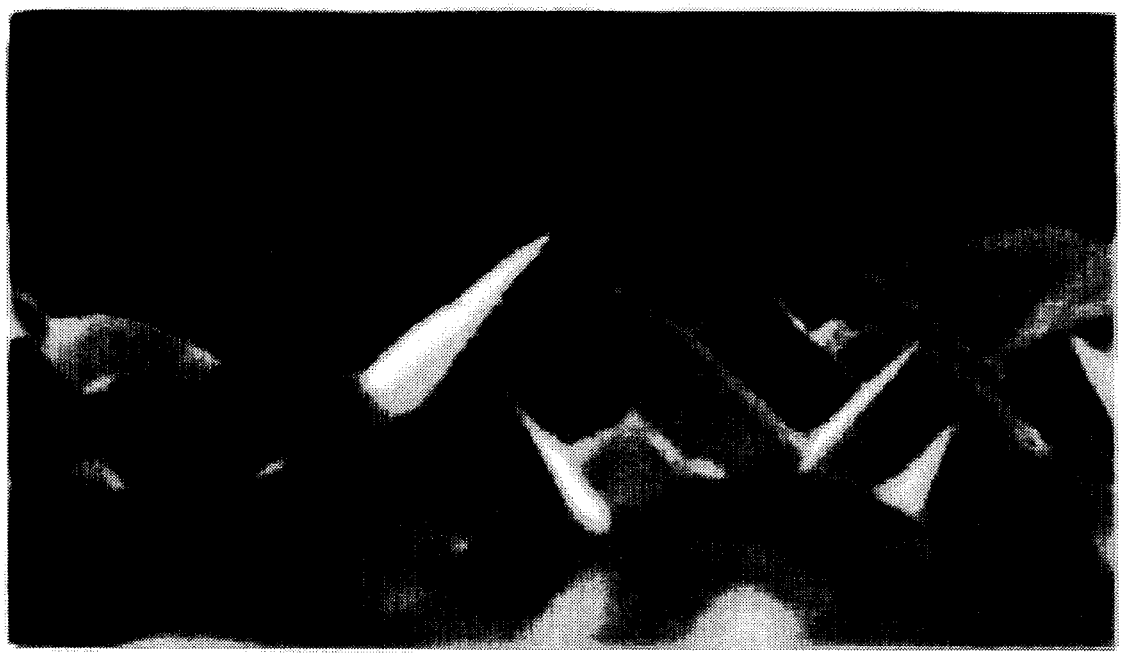
FIG. 11 is a photomicrograph showing a crystal structure of a slide surface of a slide surface construction.

FIG. 11 is a photomicrograph showing a crystal structure of the slide surface 4a in the Example No. 8. In FIG. 11, a large number of Fe crystals having three ridge lines are observed. The content S of the Fe crystals having three ridge lines, i.e., {222} oriented Fe crystals is 43%, as shown in Table 5.

Figure 12A:
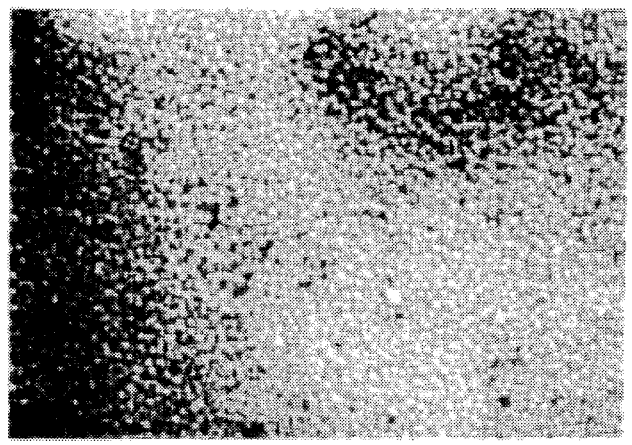
FIG. 12A is a photomicrograph showing a crystal structure of a slide surface of a slide surface construction.
Figure 12B:
FIG. 12B is an enlarged photomicrograph of FIG. 12A.
Figure 12C:
FIG. 12C is a photomicrograph showing a crystal structure of a section of the slide surface according to FIGS. 12A and 12B.

FIGS. 12A and 12B are photomicrographs showing a crystal structure of the slide surface 4a in the Example No. 9 (at different magnifications). FIG. 12C is a photomicrograph showing a crystal structure of a section in the Example No. 9. In FIGS. 12A and 12C, a large number of Fe crystals having six ridge lines are observed. As shown in Table 5, the area rate A of the Fe crystals having six ridge lines is 99%, and the average grain size d thereof is 2 μm. In this case, the content S of the {222} oriented Fe crystals is 98.6%, as shown in Table 5.

Figure 13A:
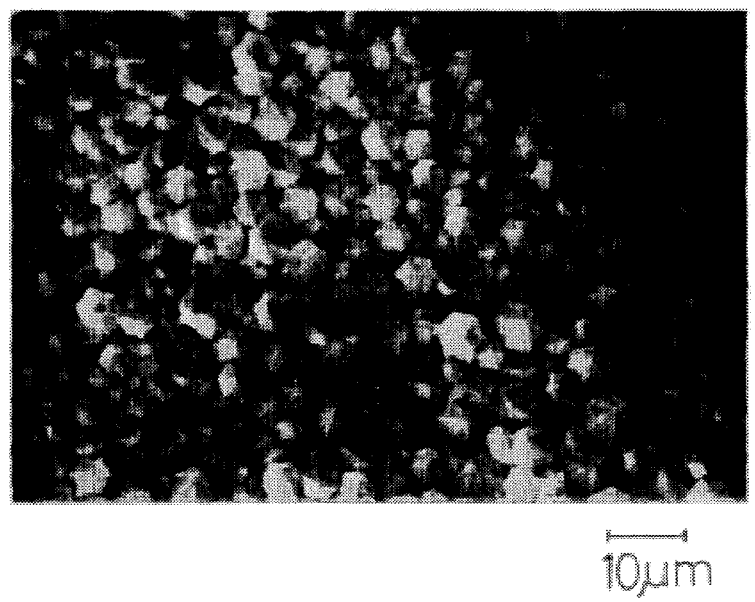
FIG. 13A is a photomicrograph showing a crystal structure of a slide surface of a slide surface construction.
Figure 13B:
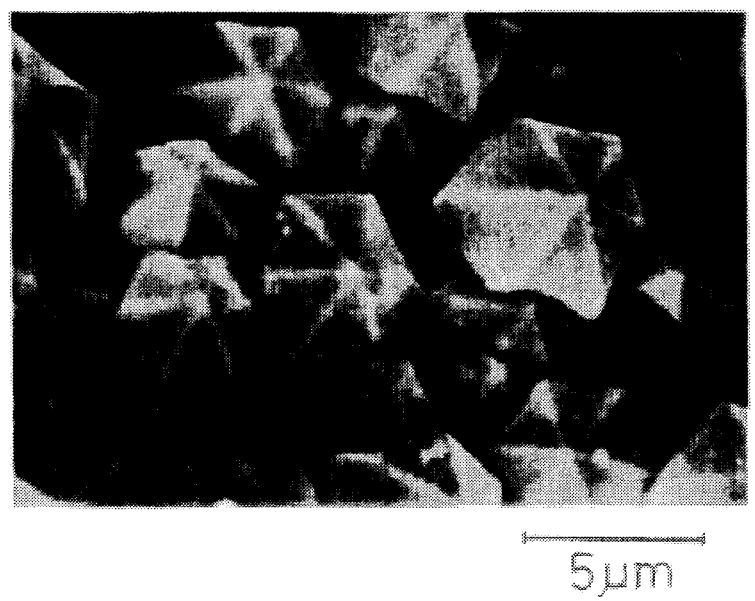
FIG. 13B is an enlarged photomicrograph of FIG. 13A.

FIGS. 13A and 13B are photomicrographs showing a crystal structure of the slide surface 4a in the Example No. 12 (at different magnifications). In FIGS. 13A and 13B, a large number of Fe crystals having six ridge lines are observed. As shown in Table 5, the area rate A of the Fe crystals having six ridge lines is 98%, and the average grain size d thereof is 5 μm. In this case, the content S of the {222} oriented Fe crystals is 97.1%., as shown in Table 5.

Figure 14:
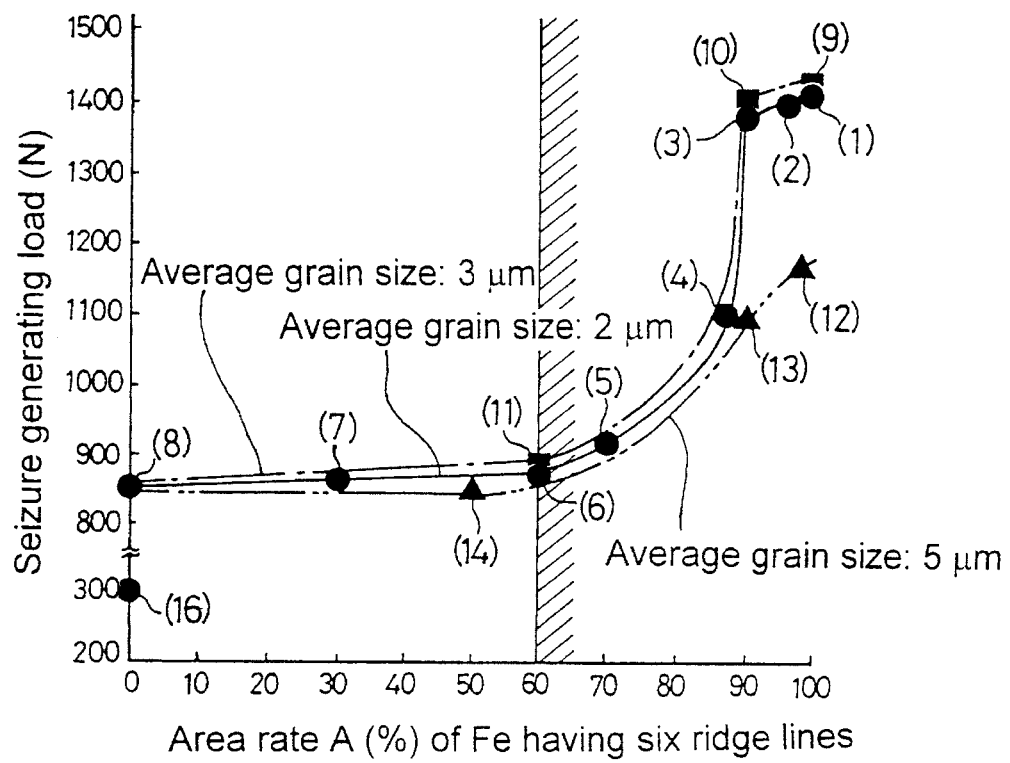
FIG. 14 is a graph illustrating the relationship between the area rate of Fe crystals having six ridge lines and the seizure generating load.

A seizure test was carried out in a chip-on-disk manner for the Example Nos. 1 to 14 and 16 to determine the relationship between the area rate A of the Fe crystals having six ridge lines and the seizure generating load, thereby providing the results shown in Table 6 and FIG. 14. Conditions for the test were as follows: the material of the disk was an Al-10% by weight of Si alloy; the rotational speed of the disk was 15 m/sec.; the amount of oil supplied was 0.3 ml/min.; and the area of the slide surface of the chip made from the slide surface construction was 1 cm².

TABLE 6

| Example No. | Seizure generating load (N) |
| --- | --- |
| 1 | 1410 |
| 2 | 1400 |
| 3 | 1380 |
| 4 | 1100 |
| 5 | 920 |
| 6 | 870 |
| 7 | 860 |
| 8 | 850 |
| 9 | 1430 |
| 10 | 1400 |
| 11 | 880 |
| 12 | 1170 |
| 13 | 1110 |
| 14 | 850 |
| 16 | 300 |

FIG. 14 is a graph taken from Table 6, wherein points (1) to (14) and (16) correspond to the Example Nos. 1 to 14 and 16, respectively.

As apparent from Table 6 and FIG. 14, in the examples 1 to 6 and 9 to 13 in which the area rate A of the Fe crystals having six ridge lines is equal to or more than 60%, the slide surface 4a has a good oil retention and a good initial conformability and therefore, the seizure generating load is increased considerably, as compared with the Example Nos. 7, 8, 14 and 16. It is apparent that particularly in the Example Nos. 1 to 3, 9 and 10 in which the average grain size d of the Fe crystals having six ridge lines is set equal to or less than 3 μm when the area rate A thereof is or equal to more than 90%, the seizure generating load is increased drastically, as compared with the examples 12 and 13 in which the average grain size d is set at a value larger than 3 μm.

Figure 15:
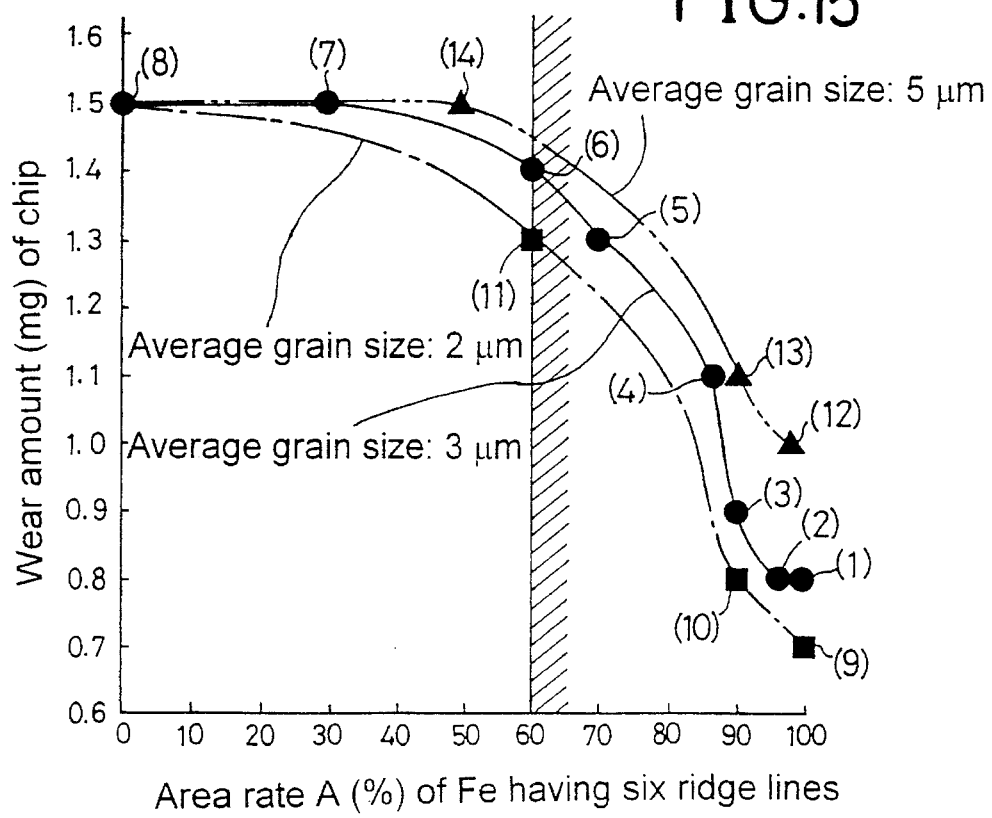
FIG. 15 is a graph illustrating the relationship between the area rate of Fe crystals having six ridge lines and the wear amount occurring without lubrication.

A wear test was carried out in a chip-on-disk manner without lubrication for the Example Nos. 1 to 14 to determine the relationship between the area rate A of the Fe crystals having six ridge lines and the amount of wear of the chip, thereby providing the results shown in FIG. 15. Conditions for the test were as follows: the material of the disk was an Al-10% by weight of Si alloy; the rotational speed of the disk was 0.5 m/sec.; the load was 100N; the slide distance was 1 km; and the area of the slide surface of the chip made from the slide surface construction was 1 cm². The wear amount of the chip is a decrement (mg) per area (1 cm²) of the chip.

TABLE 7

| Example No. | Wear amount (mg) |
| --- | --- |
| 1 | 0.8 |
| 2 | 0.8 |
| 3 | 0.9 |
| 4 | 1.1 |
| 5 | 1.3 |
| 6 | 1.4 |
| 7 | 1.5 |
| 8 | 1.5 |
| 9 | 0.7 |
| 10 | 0.8 |
| 11 | 1.3 |
| 12 | 1.0 |
| 13 | 1.1 |
| 14 | 1.5 |

FIG. 15 is a graph taken from Table 7, wherein points (1) to (14) correspond to chips in the Example Nos. 1 to 14, respectively.

As apparent from Table 7 and FIG. 15, in each of the chips in the examples 1 to 6 and 9 to 13 in which the area rate A of the Fe crystals having six ridge lines is in a range represented by A≧60%, the wear amount of the chip is smaller than those of the chips in the Example Nos. 7, 8 and 14, and hence, each of these chips has a good wear resistance even without lubrication.

Figure 16:
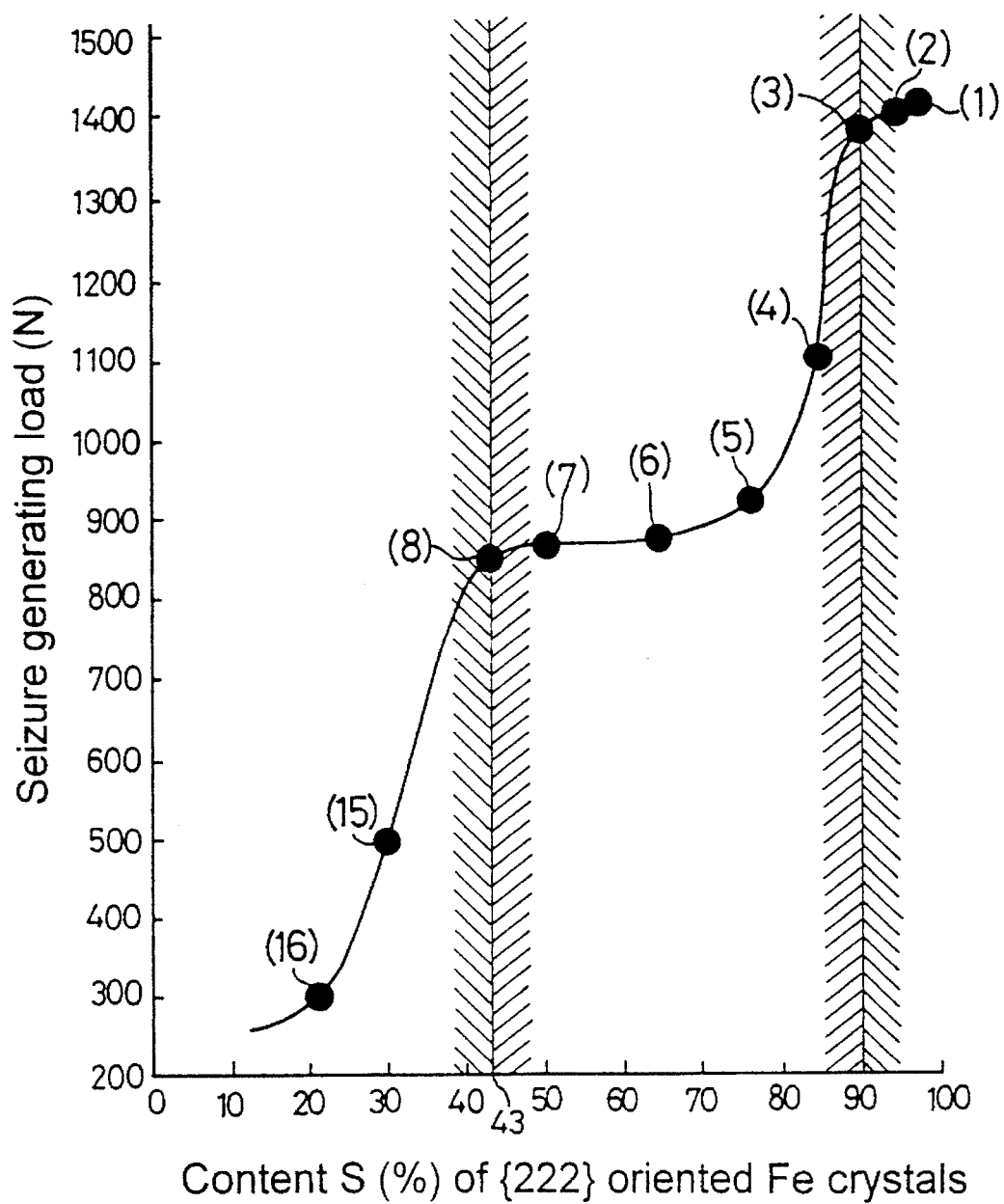
FIG. 16 is a graph illustrating the relationship between the content of {222} oriented Fe crystals and the seizure generating load.

FIG. 16 illustrates the relationship between the content S of the {222} oriented Fe crystals and the seizure generating load in the Example Nos. 1 to 8, 15 and 16. The seizure generating loads are as given in Table 6 for the Example Nos. 1 to 8 and 16. For the Example No. 15, it was ascertained in the seizure test under the same conditions as those described above that the seizure generating load was of 500N. Points (1) to (8), (15) and (16) in FIG. 16 correspond to the Example Nos. 1 to 8, 15 and 16, respectively.

In FIG. 16, a region with the content S of the {222} oriented Fe crystals equal to or more than 90% is a region in which the entire slide surface is formed substantially of Fe crystals having six ridge lines. A region with the content S in a range of 43%<S<90% is a region in which the entire slide surface is formed of a combination of Fe crystals having six ridge lines and Fe crystals having three ridge lines. Further, a region with the content S equal to 43% is a region in which the entire slide surface 4a is formed substantially of Fe crystals having three ridge lines, as in the Example No. 8. In a region with the content S<43%, the Fe crystals having three ridge lines are decreased and the fine grain-shaped Fe crystals are increased, with a reduction in the content S. In a region with content S≦ 21%, the entire slide surface 4a is formed substantially of fine grain-shaped Fe crystals, as in the Example No. 16.

As apparent from FIG. 16, in the Example Nos. 1 to 3 in which the content S of the {222} oriented Fe crystals is equal to or more than 90%, the slide surface 4a has extremely improved oil retention and initial conformability and hence, the seizure generating load is increased drastically, as compared with the Example Nos. 4 to 7 and 8. In the Example Nos. 15 and 16, the oil retention or the like is poor and hence, the seizure generating load is reduced extremely.

SECOND EMBODIMENT

In this embodiment, as in the first embodiment, a stratified slide surface construction 4 is formed by plating on outer peripheral surfaces of land portions $3_1$ and a skirt portion $3_2$ on a base material 2 of an aluminum alloy of a piston 1 for an internal combustion engine, as shown in FIGS. 1 and 2.

The slide surface construction 4 is likewise formed of an aggregate of metal crystals having a body-centered cubic structure (which will be referred to as a bcc structure). The aggregate includes a large number of (hhh) oriented metal crystals likewise grown from the base material 2 into a columnar form with their (hhh) planes (by Miller indices) oriented toward the slide surface 4a for sliding on an inner wall 5 of a cylinder bore.

Figure 17:
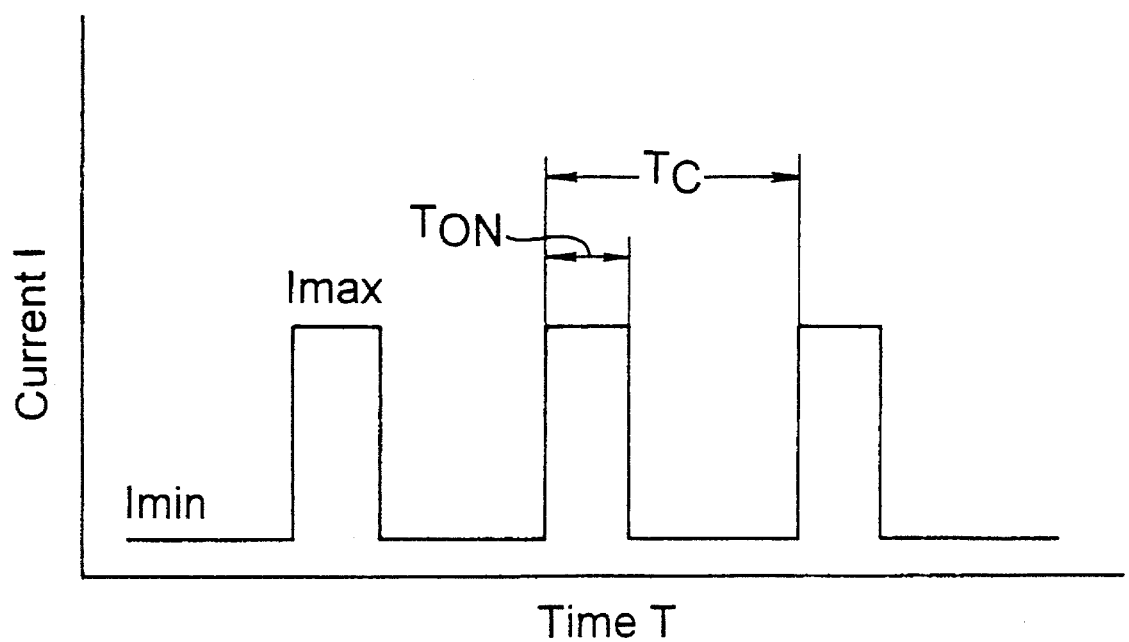
FIG. 17 is a waveform of an output from an electrolytic plating power source.

In forming the slide surface construction 4, an electrolytic plating process is utilized. In this electrolytic plating process, the electric current (output) I from a plating power source (energy source) is controlled to produce a pulse waveform with a lapse of time T, so that the electric current I is increased from a minimum current value Imin to reach a maximum current value Imax and then reduced to the minimum current value Imin, as shown in FIG. 17.

If the energization time (output time) from the starting point of the increase in the current I to the starting point of the decrease in the current I is represented by $T_{ON}$ and the cycle time $T_C$ where one cycle is defined to be from the starting point of the previous increase to the starting point of the next increase is represented by $T_C$, the ratio of the energization time $T_{ON}$ to the cycle time $T_C$, i.e., the time ratio $T_{ON}/T_C$ is set in a range represented by $T_{ON}/T_C \leq 0.45$.

In this case, in the cathode, the content S of the (hhh) oriented metal crystals can be set in a range of S≧ 40% by setting the minimum current value CDmin at 0 (zero) and setting the average current density CDm, for example, at a value in a range of CDm≧2.5 A/dm$_2$.

On the other hand, if the minimum current value CDmin is set at 0 (zero); the time ratio $T_{ON}/T_C$ is set in a range of $T_{ON}/T_C \leq 0.35$ and the average current density CDm is set in a range of CDm≧3.5 A/dm$_2$, the content S of the (hhh) oriented metal crystals can be set in a range of≧90%.

If the content S of the (hhh) oriented metal crystals is set in the range of S≧90% under the above-described forming conditions, then substantially the entire slide surface 4a can be likewise formed of the aggregate of metal crystals $7_1$ having six ridge lines 6, as shown in FIG. 4A.

If the content S of the (hhh) oriented metal crystals is in a range represented by 40%≦S≦90%, the slide surface 4a is formed of an aggregate of metal crystals $7_1$ having six ridge lines 6 and metal crystals $7_2$ having three ridge lines 6. In this case, the slide surface construction 4 has a slide characteristic lower than that of a slide surface construction 4 in which substantially the entire slide surface 4a is formed of the metal crystals $7_1$ having six ridge lines 6.

Figure 18:
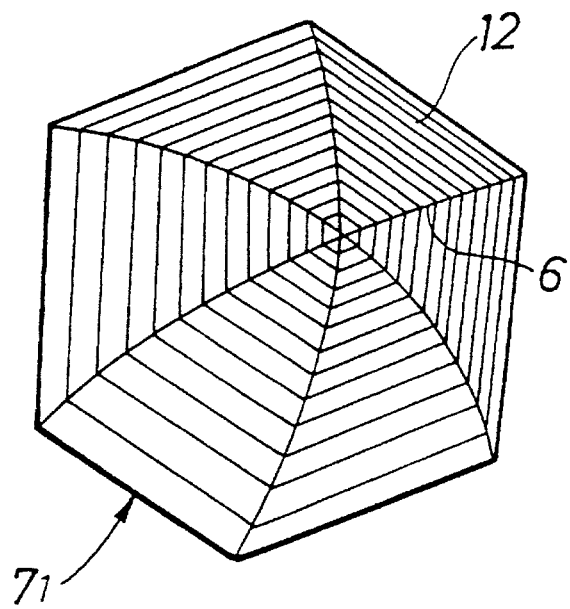
FIG. 18 is a perspective view of a metal crystal having six ridge lines.

In the above-described forming process, if the minimum current density CDmin is set in a range represented by CDmin≧0.2 A/dm$^2$; the time ratio $T_{ON}/T_C$ is set in a range represented by $T_{ON}/T_C \leq 0.35$ and the average current density CDm is set in a range represented by CDm≧3.5 A/dm$^2$, metal crystals $7_1$ having six ridge lines 6 each having a substantially flat slant 12 can be precipitated, as shown in FIG. 18.

This metal crystal $7_1$ having six ridge lines 6 has a high hardness, which is effective for increasing the wear resistance of the slide surface construction 4.

Figure 19:
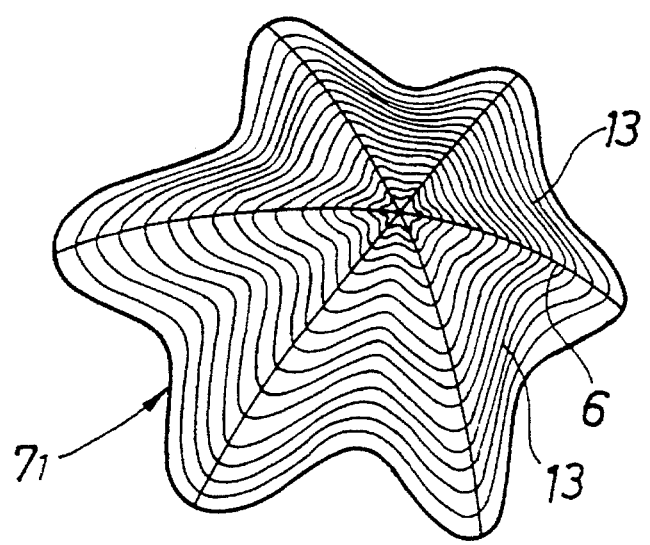
FIG. 19 is a perspective view of the metal crystal having six ridge lines formed by a method that differs from the method used in forming the metal crystal of FIG. 18.

On the other hand, if the minimum current density CDmin is set in a range represented by CDmin≦−0.2 A/dm$^2$; the time ratio $T_{ON}/T_C$ is set in a range represented by $T_{ON}/T_C \geq 0.35$ and the average current density CDm is set in a range represented by CDm≧3.5 A/dm$^2$, metal crystals $7_1$ having six ridge lines 6 each having a relatively deep valley portion 13 between adjacent ridge lines 6 can be precipitated, as shown in FIG. 19.

This metal crystal $7_1$ having six ridge lines 6 has a good oil retention attributable to such valley portion 13 and therefore is effective for increasing the seizure resistance of the slide surface construction 4.

The metal crystals having the bcc structures usable in this invention include those of simple metals such as Fe, Cr, Mo, W, Ta, Zr, Nb, V, etc., and the alloys thereof.

In addition to the electrolytic plating, other plating treatments that may be used are PVD processes, CVD processes, sputtering processes, ion plating and the like, which are gas-phase plating processes. When a W-plating or Mo-plating is carried out by sputtering process, the conditions are controlled to provide, for example, an argon pressure of 0.2 to 1 Pa, a temperature of the base material of 150° to 300° C. and an average argon acceleration power (energy source) of 1 to 1.5 kW. When a W-plating is carried out by a CVD process, conditions are controlled to provide, for example, a WF6 (a starting material) flow rate of 2 to 15 cc/min., a pressure of 50 to 300 Pa within a chamber, a temperature of the base material of 100° to 400° C., and an average output power of ArF excimer laser (energy source) of 5 to 40 W.

GROUP-A

A slide surface construction 4 having a thickness of 15 μm and formed of an aggregate of Fe crystals was formed on the outer peripheral surfaces of the land portions $3_1$ and the skirt portion $3_2$ of the aluminum alloy base material 2 by the utilization of an electrolytic Fe plating process, thereby producing a piston 1 for internal combustion engines. The following various considerations were made for slide surface constructions of such pistons 1:

(a) (a) With regard to time ratio $T_{ON}/T_C$:

Table 8 shows plating bath conditions for Example Nos. 1 to 24 and 50 to 54 of the slide surface constructions 4.

TABLE 8

| Example No. | Plating bath conditions | | | |
|---|---|---|---|---|
| | Concentration of ferrous sulfate (g/liter) | Concentration of Fe$^{2+}$ ions (mol/liter) | pH | Temperature (°C.) |
| 1–24, 50–54 | 400 | 1.4 | 6 | 50 |

Table 9 shows plating conditions for the Example Nos. 1 to 14. In this case, the average current density CDm was set at 7 A/dm$^2$ for the Example Nos. 1 to 6, and at 4 A/dm$^2$ for the Example Nos. 7 to 14, and the time ratio $T_{ON}/T_C$ was varied while keeping the average current density constant.

TABLE 9

| Example No. | Treating conditions of plating | | | | |
|---|---|---|---|---|---|
| | Minimum current density CDmin (A/dm$^2$) | Maximum current density CDmax (A/dm$^2$) | Average current density CDm (A/dm$^2$) | Time ratio $T_{ON}/T_C$ | Output time $T_{ON}$ (msec) |
| 1 | 0 | 140 | 7 | 0.05 | 2 |
| 2 | 0 | 35 | 7 | 0.2 | 2 |
| 3 | 0 | 23 | 7 | 0.3 | 2 |
| 4 | 0 | 17.5 | 7 | 0.4 | 2 |
| 5 | 0 | 14 | 7 | 0.5 | 2 |
| 6 | 0 | DC 7 | DC 7 | ∞ | ∞ |
| 7 | 0 | 80 | 4 | 0.05 | 2 |
| 8 | 0 | 20 | 4 | 0.2 | 2 |
| 9 | 0 | 20 | 4 | 0.2 | 1 |
| 10 | 0 | 20 | 4 | 0.2 | 1 |
| 11 | 0 | 13 | 4 | 0.3 | 2 |
| 12 | 0 | 10 | 4 | 0.4 | 2 |
| 13 | 0 | 8 | 4 | 0.5 | 2 |
| 14 | 0 | DC 4 | DC 4 | ∞ | ∞ |

Table 10 shows plating conditions for the Example Nos. 15 to 24. In this case, the average current density CDm was set at 3.5 A/dm$^2$ for the Example Nos. 15 to 19, and at 3 A/dm$^2$ for the Example Nos. 20 to 24, and the time ratio $T_{ON}/T_C$ was varied while keeping the average current density CDm constant.

TABLE 10

| Example No. | Treating conditions of plating | | | | |
|---|---|---|---|---|---|
| | Minimum current density CDmin (A/dm$^2$) | Maximum current density CDmax (A/dm$^2$) | Average current density CDm (A/dm$^2$) | Time ratio $T_{ON}/T_C$ | Output time $T_{ON}$ (msec) |
| 15 | 0 | 70 | 3.5 | 0.05 | 2 |
| 16 | 0 | 17.5 | 3.5 | 0.2 | 2 |
| 17 | 0 | 11.5 | 3.5 | 0.3 | 2 |
| 18 | 0 | 8.5 | 3.5 | 0.4 | 2 |
| 19 | 0 | 7 | 3.5 | 0.5 | 2 |
| 20 | 0 | 60 | 3 | 0.05 | 2 |
| 21 | 0 | 15 | 3 | 0.2 | 2 |
| 22 | 0 | 10 | 3 | 0.3 | 2 |
| 23 | 0 | 7.5 | 3 | 0.4 | 2 |
| 24 | 0 | 6 | 3 | 0.5 | 2 |

Table 11 shows plating conditions for Example Nos. 50 to 54. In this case, the average current density CDm was set at 2.5 A/cm$^2$, and the time ratio $T_{ON}/T_C$ was varied while keeping the average current density CDm constant.

TABLE 11

| Example No. | Treating conditions of plating | | | | |
|---|---|---|---|---|---|
| | Minimum current density CDmin (A/dm$^2$) | Maximum current density CDmax (A/dm$^2$) | Average current density CDm (A/dm$^2$) | Time ratio $T_{ON}/T_C$ | Output time $T_{ON}$ (msec) |
| 50 | 0 | 50 | 2.5 | 0.05 | 2 |
| 51 | 0 | 12.5 | 2.5 | 0.2 | 2 |
| 52 | 0 | 8.5 | 2.5 | 0.3 | 2 |
| 53 | 0 | 6.5 | 2.5 | 0.4 | 2 |
| 54 | 0 | 5 | 2.5 | 0.5 | 2 |

Table 12 shows the crystal shape of the slide surface 4a, the area rate A and average grain size d of Fe crystals having six ridge lines, the content S of the oriented Fe crystals, and hardness of the oriented Fe crystals in the Example Nos. 1 to 24 and 50 to 54, respectively.

TABLE 12

| Example No. | Crystal shape of slide surface | Fe crystals having six ridge lines | | Content S (%) of oriented Fe cyrstals | | | | | Hardness (Hv) |
|---|---|---|---|---|---|---|---|---|---|
| | | Area rate A (%) | Average grain size d (μm) | {110} | {200} | {211} | {310} | {222} | |
| 1 | Hexagonal pyramid | 100 | 5 | 0 | 0.2 | 1.8 | 0 | 98 | 370 |
| 2 | Hexagonal pyramid | 100 | 5 | 0 | 0 | 2.9 | 0 | 97.1 | 375 |
| 3 | Hexagonal pyramid | 98 | 5 | 0.4 | 0.8 | 2 | 0.3 | 96.5 | 370 |
| | Trigonal pyramid | ≦1 | — | | | | | | |
| 4 | Hexagonal pyramid | 75 | 5 | 1.1 | 2.6 | 9.7 | 1.3 | 85.3 | 325 |
| | Trigonal pyramid | 10 | — | | | | | | |
| 5 | Granular | — | — | 10.2 | 23.1 | 17 | 25.4 | 24.3 | 270 |
| 6 | Granular | — | — | 13 | 27.7 | 14.8 | 26.2 | 18.3 | 250 |
| 7 | Hexagonal pyramid | 97 | 3 | 0 | 0.9 | 3.2 | 0 | 95.9 | 385 |

TABLE 12-continued

| | | Fe crystals having six ridge lines | | | | | | | |
|---|---|---|---|---|---|---|---|---|---|
| Example No. | Crystal shape of slide surface | Area rate A (%) | Average grain size d (μm) | Content S (%) of oriented Fe cyrstals {110} | {200} | {211} | {310} | {222} | Hardness (Hv) |
| | Trigonal pyramid | ≦1 | — | | | | | | |
| 8 | Hexagonal pyramid | 96 | 3 | 0.5 | 1.2 | 3.3 | 0.7 | 94.3 | 380 |
| | Trigonal pyramid | ≦1 | — | | | | | | |
| 9 | Hexagonal pyramid | 98 | 3 | 0.6 | 1.2 | 2.1 | 0.4 | 95.7 | 380 |
| | Trigonal pyramid | ≦1 | — | | | | | | |
| 10 | Hexagonal pyramid | 94 | 3 | 0.5 | 1.4 | 4.2 | 0.5 | 93.4 | 360 |
| | Trigonal pyramid | ≦1 | — | | | | | | |
| 11 | Hexagonal pyramid | 94 | 3 | 0.6 | 1 | 4.4 | 0.5 | 93.5 | 360 |
| | Trigonal pyramid | ≦1 | — | | | | | | |
| 12 | Hexagonal pyramid | 70 | 3 | 2.6 | 4.3 | 10.5 | 2.5 | 80.1 | 330 |
| | Trigonal pyramid | 10 | — | | | | | | |
| 13 | Granular | — | — | 10.4 | 21.1 | 16.8 | 25.3 | 26.4 | 260 |
| 14 | Granular | — | — | 11.2 | 26.4 | 15 | 27.1 | 20.3 | 250 |
| 15 | Hexagonal pyramid | 93 | 2 | 0.6 | 1.5 | 4.6 | 0.6 | 92.7 | 390 |
| | Trigonal pyramid | ≦1 | — | | | | | | |
| 16 | Hexagonal pyramid | 92 | 2 | 0.8 | 1.6 | 5.1 | 1 | 91.5 | 390 |
| | Trigonal pyramid | ≦1 | — | | | | | | |
| 17 | Hexagonal pyramid | 90 | 2 | 1 | 2.1 | 5.3 | 1 | 90.6 | 370 |
| | Trigonal pyramid | ≦1 | — | | | | | | |
| 18 | Hexagonal pyramid | 65 | 2 | 3.8 | 3.3 | 15.4 | 3.6 | 73.9 | 350 |
| | Trigonal pyramid | 10 | — | | | | | | |
| 19 | Granular | — | — | 8.5 | 19.8 | 17.1 | 26 | 28.6 | 260 |
| 20 | Hexagonal pyramid | 70 | 2 | 2.6 | 3 | 12.9 | 2 | 79.5 | 350 |
| | Trigonal pyramid | 10 | — | | | | | | |
| 21 | Hexagonal pyramid | 65 | 2 | 2.8 | 4.1 | 13.8 | 2.5 | 76.8 | 330 |
| | Trigonal pyramid | 10 | — | | | | | | |
| 22 | Hexagonal pyramid | 60 | 2 | 3.1 | 5.3 | 18.5 | 2.8 | 70.3 | 320 |
| | Trigonal pyramid | 10 | — | | | | | | |
| 23 | Hexagonal pyramid | 10 | 3 | 11.9 | 3.5 | 30.2 | 3.3 | 51.1 | 280 |
| | Trigonal pyramid | 45 | — | | | | | | |
| 24 | Granular | — | — | 8.7 | 14 | 19.8 | 25.2 | 32.3 | 270 |
| 50 | Hexagonal pyramid | 50 | 1.5 | 5.7 | 5.9 | 17.3 | 4 | 67.1 | 340 |
| | Trigonal pyramid | 15 | — | | | | | | |
| 51 | Hexagonal pyramid | 40 | 1.5 | 5.1 | 6.8 | 18.8 | 4.8 | 64.5 | 330 |
| | Trigonal pyramid | 25 | — | | | | | | |
| 52 | Hexagonal pyramid | 10 | 1.5 | 10.2 | 5.4 | 25.3 | 3.8 | 55.3 | 300 |
| | Trigonal pryamid | 45 | — | | | | | | |

TABLE 12-continued

| Example No. | Crystal shape of slide surface | Fe crystals having six ridge lines | | Content S (%) of oriented Fe cyrstals | | | | | Hardness (Hv) |
|---|---|---|---|---|---|---|---|---|---|
| | | Area rate A (%) | Average grain size d (μm) | {110} | {200} | {211} | {310} | {222} | |
| 53 | Hexagonal pyramid | 5 | 1.5 | 20.1 | 4.7 | 26.3 | 2.5 | 46.4 | 270 |
| | Trigonal pyramid | 40 | — | | | | | | |
| 54 | Granular | — | — | 9.9 | 13.1 | 17.3 | 23.2 | 36.5 | 270 |

The area rate A of the Fe crystals having six ridge lines was determined according to A=(C/B)×100 (%), wherein B represents an area of the slide surface 4a, and C represents an area occupied by all the Fe crystals having six ridge lines in the slide surface 4a. The grain size of the Fe crystals having six ridge lines is likewise an average value of distances between the mutually opposed corners on the opposite sides of an apex, i.e., three distances.

The content S was determined in the same manner as described above on the basis of X-ray diffraction pattern (X-ray was applied in a direction perpendicular to the slide surface 4a) for the Example Nos. 1 to 24 and 50 to 54.

Figure 20:
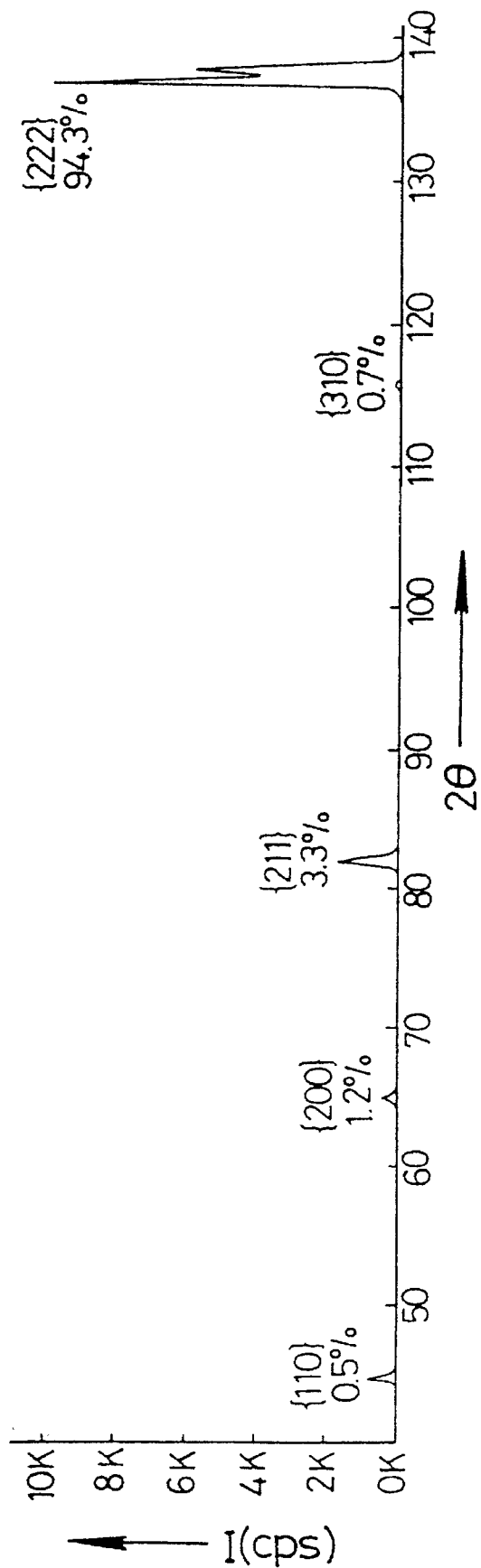
FIG. 20 is an X-ray diffraction pattern for a slide surface construction.

FIG. 20 is an X-ray diffraction pattern for the Example No. 8. For measurements (cps) $I_{110}$, $I_{200}$, $I_{211}$, $I_{310}$ and $I_{222}$ of intensity of X-ray reflected from each crystal plane, $I_{110}$=0.8K, $I_{200}$=0.4K, $I_{200}$≧1.7K, $I_{310}$ =0.15K and $I_{222}$= 9.8K. For intensity ratios $IA_{110}$, $IA_{200}$, $IA_{211}$, $IA_{310}$ and $IA_{222}$ of X-ray reflected each crystal plane in an ASTM card, $IA_{110}$=100, $IA_{200}$=20, $IA_{211}$=30, $IA_{310}$=12 and $IA_{222}$=6. Hence, T=$(I_{100}/IA_{110})+(I_{200}/IA_{200})+(I_{211}/IA_{211})+(I_{310}/IA_{310})+(I_{222}/IA_{222})$=1.73K.

Figure 21:
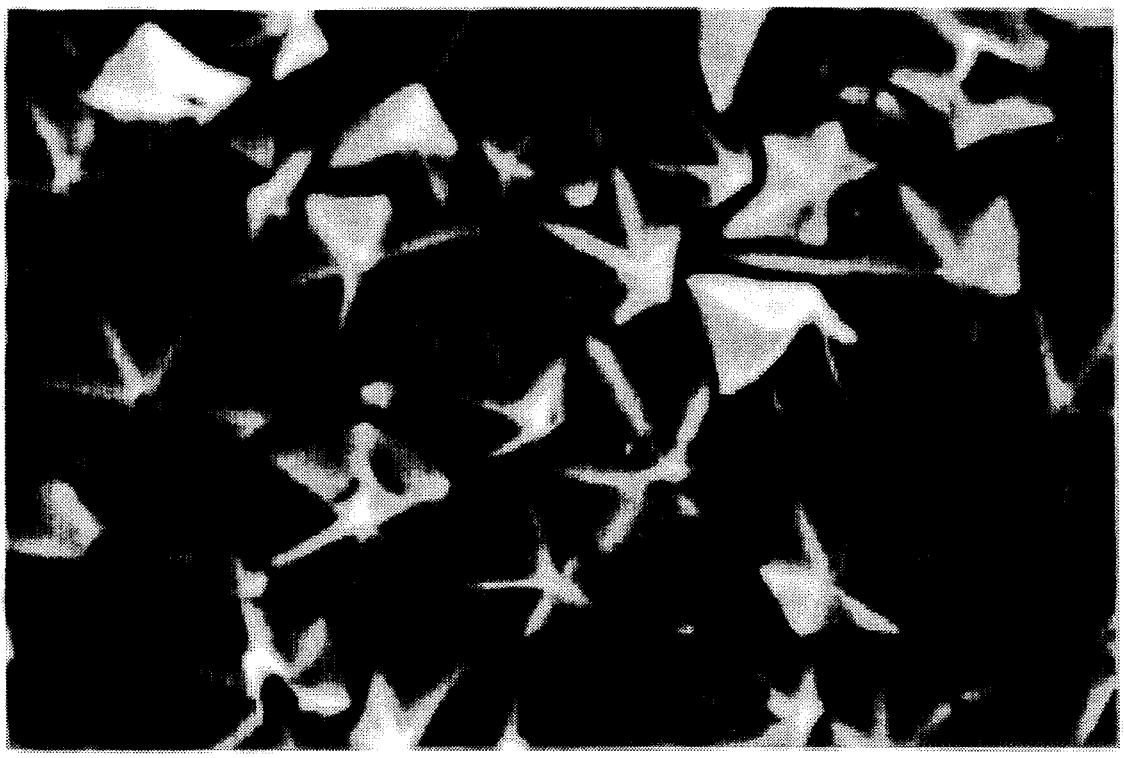
FIG. 21 is a photomicrograph showing a crystal structure of a slide surface of a slide surface construction.

FIG. 21 is a photomicrograph showing a crystal structure of the slide surface 4a in the Example No. 8, in which a large number of Fe crystals having six ridge lines of a hexangular pyramid shape are observed. As shown in Table 12, the area rate A of the Fe crystals having six ridge lines is 96%, and the average grain size d thereof is 3 μm. This Fe crystal having six ridge lines is a {222} oriented Fe crystal with its (hhh) plane, i.e., {222} plane oriented toward the slide surface 4a. In this case, the content S of the oriented Fe crystals is 94.3%, as shown in FIG. 20.

Figure 22:
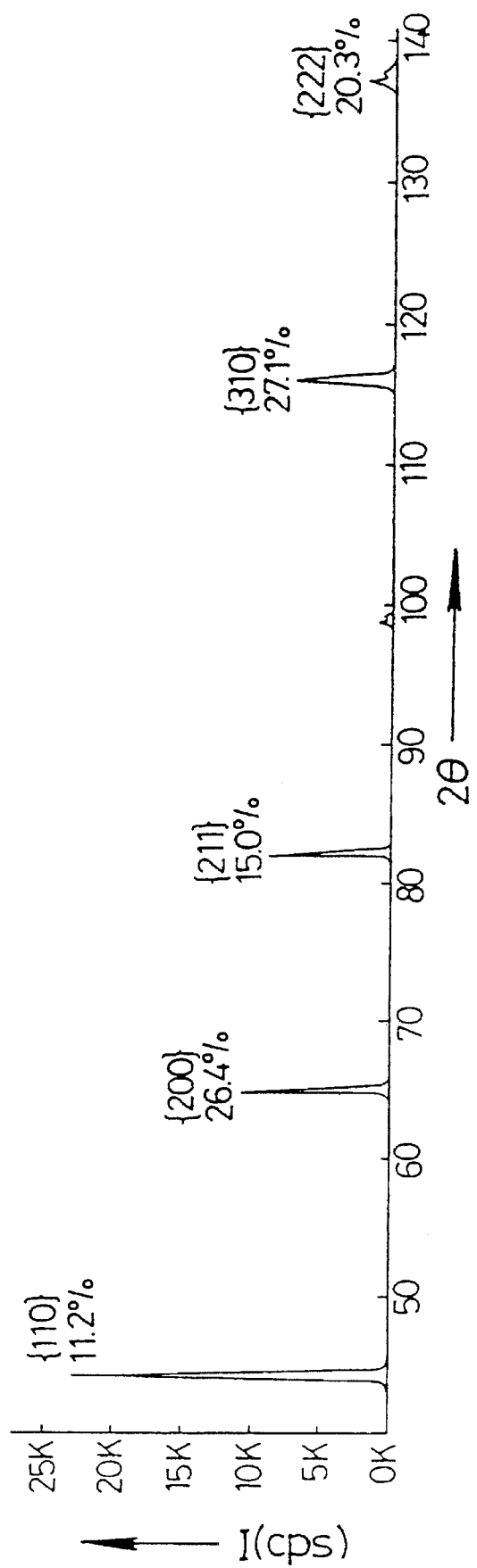
FIG. 22 is an X-ray diffraction pattern for the slide surface construction.
Figure 23:
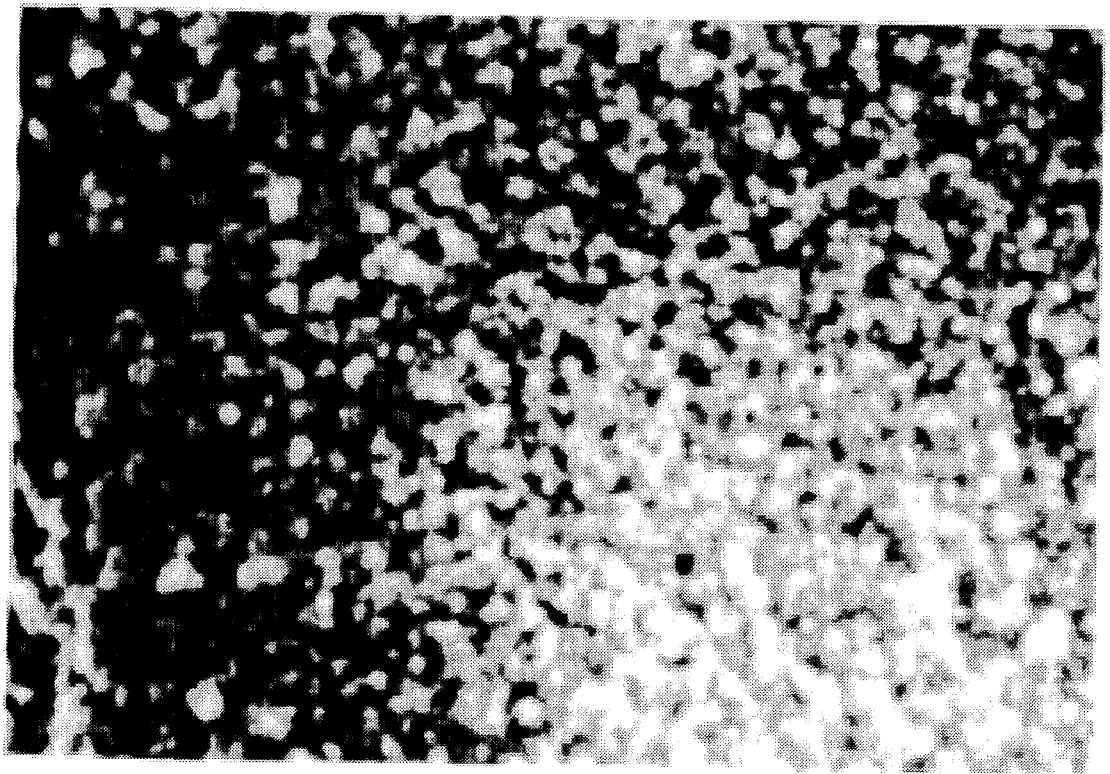
FIG. 23 is a photomicrograph showing a crystal structure of a slide surface of a slide surface construction.

FIG. 22 is an X-ray diffraction pattern of the Example No. 14. FIG. 23 is a photomicrograph showing a crystal structure of the slide surface 4a in the Example No. 14, in which a large number of granular Fe crystals are observed.

Figure 24:
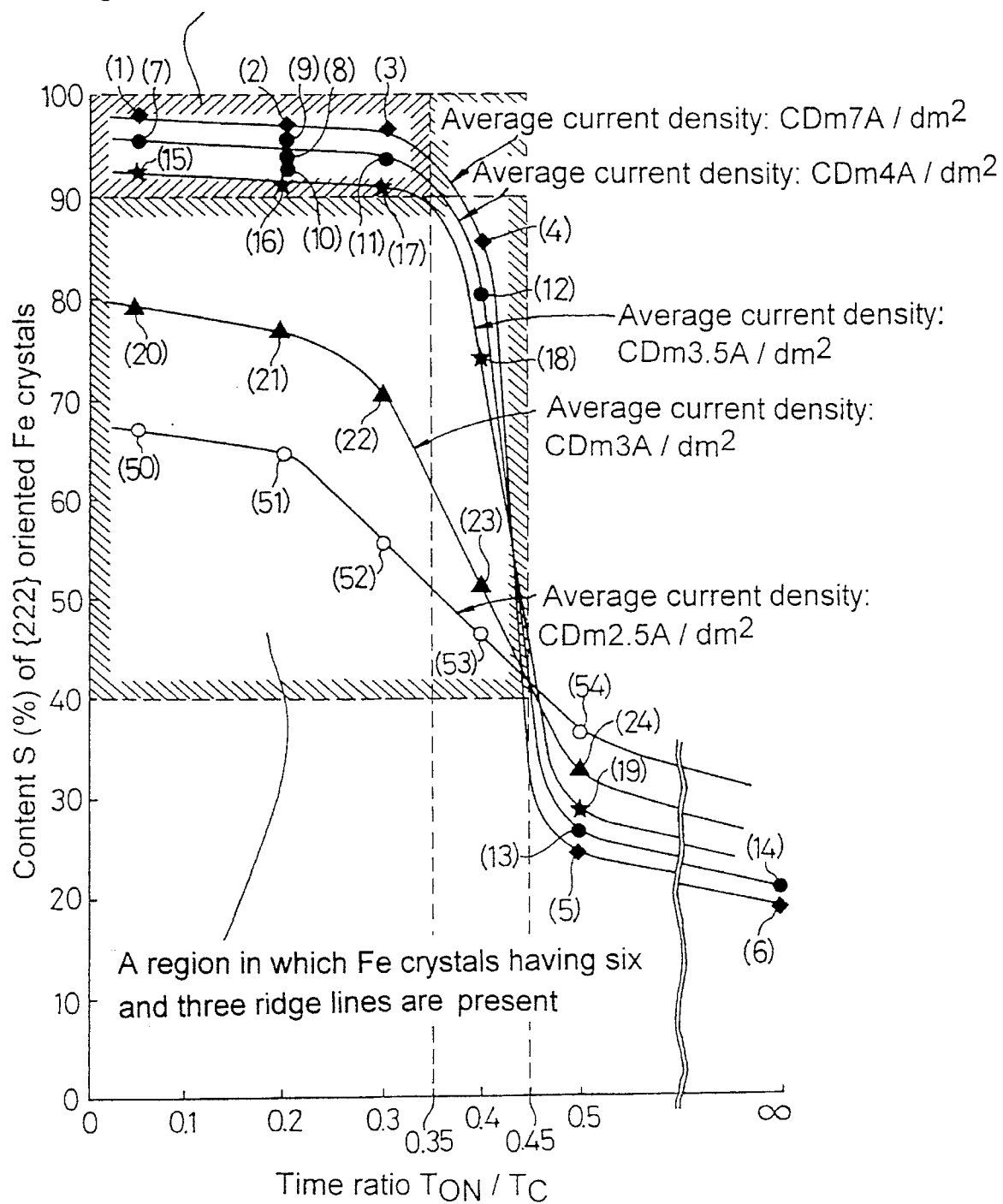
FIG. 24 is a graph illustrating the relationship between the time ratio $T_{ON}/T_C$ and the content S of {222} oriented Fe crystals.

FIG. 24 shows the relationship between the time ratio $T_{ON}/T_C$ and the content S of the {222} oriented Fe crystals in the Example Nos. 1 to 24 and 50 to 54. In FIG. 24, points (1) to (24) and (50) to (54) correspond to the Example Nos. 1 to 24 and 50 to 54. As apparent from FIG. 24, the content S of the {222} oriented Fe crystals can be provided in a range represented by S≧40%, at respective average current density CDm by setting the time ratio $T_{ON}/T_C$ in a range represented by $T_{ON}/T_C$≦0.45.

In this case, if the average current density CDm is set in a range of CDm≧3.5 A/dm² and the time ratio $T_{ON}/T_C$ in a range $T_{ON}/T_C$≦0.35, the content S of the {222} oriented Fe crystals ms in a range S≧90%. In a region of 90≦S≧100% and 0≦$T_{ON}/T_C$≦0.35 in FIG. 24, most of the {222} oriented Fe crystals are in the form of Fe crystals having six ridge lines.

On the other hand, a region in FIG. 24 obtained by eliminating a region in which the Fe crystals having six ridge lines are present alone from a region of S≧40% and $T_{ON}/T_C$≦0.45 is a region in which both the Fe crystals having six ridge lines and the Fe crystals having three ridge lines are present.

(b) With regard to concentration of Fe ions ($Fe^{2+}$) in the plating bath:

Table 13 shows plating conditions for the Example Nos. 25 to 36 of the slide surface constructions 4.

TABLE 13

| | Plating bath conditions | | | |
|---|---|---|---|---|
| Example No. | Concentration of ferrous sulfate (g/liter) | Concentration of $Fe^{2+}$ ions (mol/liter) | pH | Temperature (°C.) |
| 25 | 300 | 1.05 | 6 | 50 |
| 26 | 200 | 0.7 | 6 | 50 |
| 27 | 100 | 0.35 | 6 | 50 |
| 28 | 500 | 1.75 | 6 | 50 |
| 29 | 300 | 1.05 | 6 | 50 |
| 30 | 200 | 0.7 | 6 | 50 |
| 31 | 100 | 0.35 | 6 | 50 |
| 32 | 500 | 1.75 | 6 | 50 |
| 33 | 300 | 1.05 | 6 | 50 |
| 34 | 200 | 0.7 | 6 | 50 |
| 35 | 300 | 1.05 | 6 | 50 |
| 36 | 200 | 0.7 | 6 | 50 |

Table 14 shows plating conditions for the Example Nos. 25 to 36. In this case, the average current density CDm was set at 7 A/dm² in the Example Nos. 25 to 27, at 4 A/dm² in the Example Nos. 28 to 31, at 3.5 A/dm² in the Example Nos. 32 to 34 and at 3 A/dm² in the Example Nos. 35 and 36. The concentration of Fe ions ($Fe^{2+}$) was varied while keeping the current density CDm as shown in Table 13 constant.

TABLE 14

| | Treating conditions of plating | | | | |
|---|---|---|---|---|---|
| Example No. | Minimum current density CDmin (A/dm²) | Maximum current density CDmax (A/dm²) | Average current density CDm (A/dm²) | Time ratio $T_{ON}/T_C$ | Output time $T_{ON}$ (msec) |
| 25 | 0 | 35 | 7 | 0.2 | 2 |
| 26 | 0 | 35 | 7 | 0.2 | 2 |
| 27 | 0 | 35 | 7 | 0.2 | 2 |
| 28 | 0 | 20 | 4 | 0.2 | 2 |
| 29 | 0 | 20 | 4 | 0.2 | 2 |
| 30 | 0 | 20 | 4 | 0.2 | 2 |
| 31 | 0 | 20 | 4 | 0.2 | 2 |

TABLE 14-continued

| | Treating conditions of plating | | | | |
|---|---|---|---|---|---|
| Example No. | Minimum current density CDmin (A/dm$^2$) | Maximum current density CDmax (A/dm$^2$) | Average current density CDm (A/dm$^2$) | Time ratio $T_{ON}/T_C$ | Output time $T_{ON}$ (msec) |
| 32 | 0 | 17.5 | 3.5 | 0.2 | 2 |
| 33 | 0 | 17.5 | 3.5 | 0.2 | 2 |
| 34 | 0 | 17.5 | 3.5 | 0.2 | 2 |
| 35 | 0 | 15 | 3 | 0.2 | 2 |
| 36 | 0 | 15 | 3 | 0.2 | 2 |

Table 15 shows the crystal shape of the slide surface 4a, the area rate A and average grain size d of the Fe crystals having six ridge lines, the content S of the oriented Fe crystals, and the hardness of the oriented Fe crystals for the Example Nos. 25 to 36, respectively.

Figure 25:
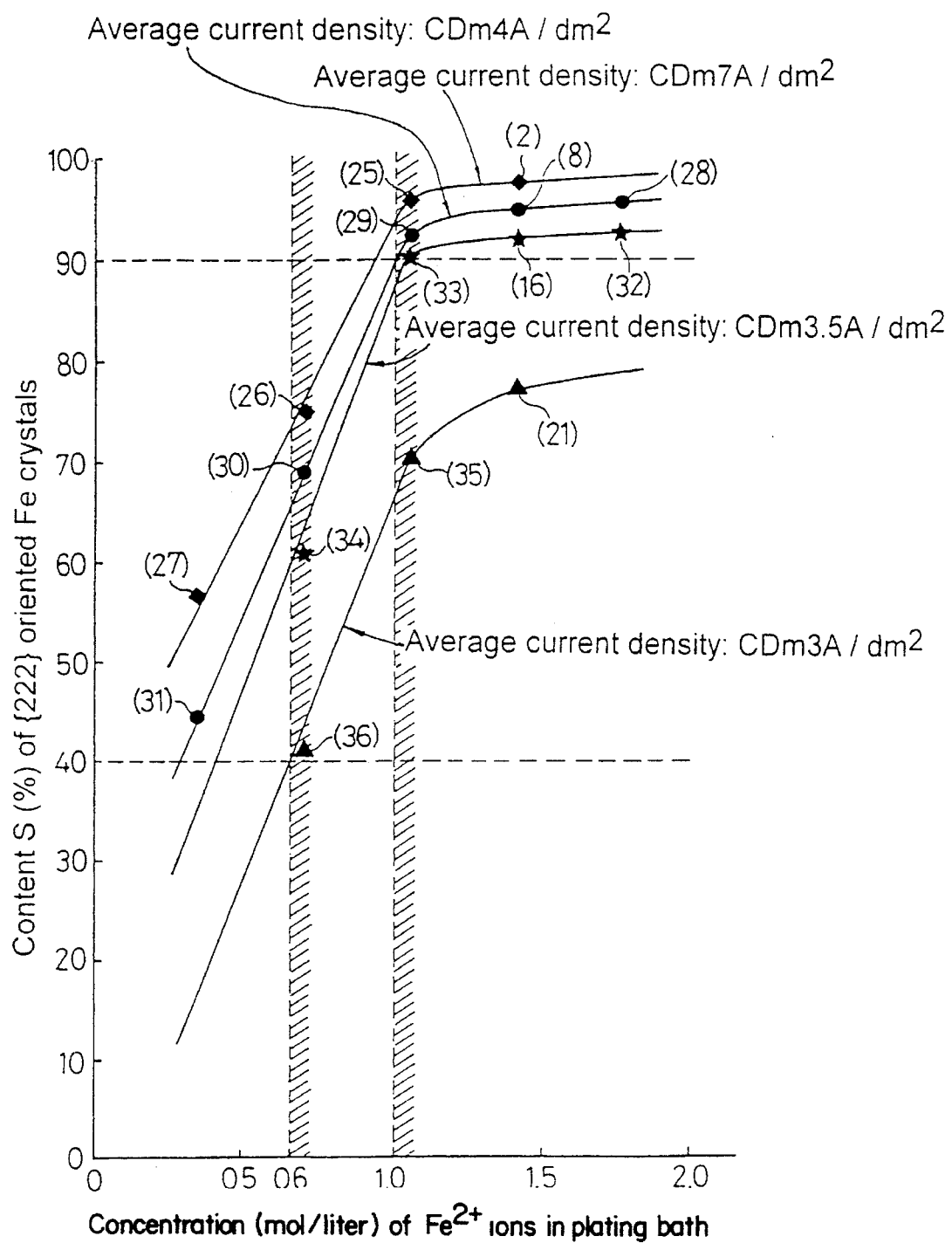
FIG. 25 is a graph illustrating the relationship between the concentration $Fe^{2+}$ of Fe ions in a plating bath and the content S of the {222} oriented Fe crystals.

FIG. 25 shows the relationship between the concentration of Fe ions ($Fe^{2+}$) in the plating bath and the content S of the {222} oriented Fe crystals in the Example Nos. 25 to 36 and the above-described Example Nos. 2, 8, 16 and 21. In FIG. 25, points (2), (8), (16), (21), (25) to (36) correspond to the Example Nos. 2, 8, 28, 21, 25 to 36. As apparent from FIG. 25, the content S of the {222} oriented Fe crystals can be set in a range S≧40% by setting the concentration of $Fe^{2+}$ ions in a range $Fe^{2+}$≧0.6, for example, at an average current density Cdm≧A/dm$^2$. In order to set the content S of the {222} oriented Fe crystals in a range S≧90%, it is necessary to set the concentration of $Fe^{2+}$ ions in a range of $Fe^{2+}$≧1 at an average current density Cdm≧3.5 A/dm$^2$.

(c) With regard to pH of plating bath:

Table 16 shows plating conditions for the Example Nos. 37 to 47 of the slide surface constructions 4.

TABLE 15

| Example No. | Crystal shape of slide surface | Fe crystals having six ridge lines | | Content S (%) of oriented Fe cyrstals | | | | | Hardness (Hv) |
|---|---|---|---|---|---|---|---|---|---|
| | | Area rate A (%) | Average grain size d (μm) | {110} | {200} | {211} | {310} | {222} | |
| 25 | Hexagonal pyramid | 96 | 5 | 0.8 | 1.3 | 2 | 0.5 | 95.4 | 365 |
| | Trigonal pyramid | ≦1 | — | | | | | | |
| 26 | Hexagonal pyramid | 65 | 5 | 3.1 | 4.8 | 15.2 | 2.2 | 74.7 | 280 |
| | Trigonal pyramid | 10 | — | | | | | | |
| 27 | Hexagonal pyramid | 10 | 5 | 10.4 | 3.6 | 26.7 | 2.7 | 56.6 | 210 |
| | Trigonal pyramid | 45 | — | | | | | | |
| 28 | Hexagonal pyramid | 95 | 3 | 0.7 | 1.4 | 2.3 | 0.7 | 94.9 | 380 |
| | Trigonal pyramid | ≦1 | — | | | | | | |
| 29 | Hexagonal pyramid | 92 | 3 | 1.5 | 2.3 | 3.2 | 0.9 | 92.1 | 365 |
| | Trigonal pyramid | ≦1 | — | | | | | | |
| 30 | Hexagonal pyramid | 60 | 3 | 5.8 | 3.6 | 19.1 | 2.5 | 69 | 300 |
| | Trigonal pyramid | 10 | — | | | | | | |
| 31 | Trigonal pyramid | 45 | — | 20.8 | 3.5 | 28.8 | 2.4 | 44.5 | 270 |
| 32 | Hexagonal pyramid | 92 | 2 | 1.5 | 2 | 3.5 | 1 | 92 | 390 |
| | Trigonal pyramid | ≦1 | — | | | | | | |
| 33 | Hexagonal pyramid | 90 | 2 | 1.8 | 2.4 | 4.6 | 1 | 90.2 | 380 |
| | Trigonal pyramid | ≦1 | — | | | | | | |
| 34 | Hexagonal pyramid | 40 | 2 | 11.3 | 3.8 | 22.2 | 2 | 60.7 | 320 |
| | Trigonal pyramid | 20 | — | | | | | | |
| 35 | Hexagonal pyramid | 60 | 2 | 6 | 3.9 | 17.6 | 2.6 | 69.9 | 300 |
| | Trigonal pyramid | 10 | — | | | | | | |
| 36 | Trigonal pyramid | 40 | — | 17.5 | 9.7 | 20.3 | 11.8 | 40.7 | 275 |

TABLE 16

| Example No. | Plating bath conditions | | | |
|---|---|---|---|---|
| | Concentration of ferrous sulfate (g/liter) | Concentration of $Fe^{2+}$ ions (mol/liter) | pH | Temperature (°C.) |
| 37 | 400 | 1.4 | 5.5 | 50 |
| 38 | 400 | 1.4 | 5 | 50 |
| 39 | 400 | 1.4 | 4 | 50 |
| 40 | 400 | 1.4 | 7 | 50 |
| 41 | 400 | 1.4 | 5.5 | 50 |
| 42 | 400 | 1.4 | 5 | 50 |
| 43 | 400 | 1.4 | 7 | 50 |
| 44 | 400 | 1.4 | 5.5 | 50 |
| 45 | 400 | 1.4 | 5 | 50 |
| 46 | 400 | 1.4 | 5.5 | 50 |
| 47 | 400 | 1.4 | 5 | 50 |

TABLE 17

| Example No. | Treating conditions of plating | | | | |
|---|---|---|---|---|---|
| | Minimum current density CDmin (A/dm$^2$) | Maximum current density CDmax (A/dm$^2$) | Average current density CDm (A/dm$^2$) | Time ratio $T_{ON}/T_C$ | Output time $T_{ON}$ (msec) |
| 37 | 0 | 35 | 7 | 0.2 | 2 |
| 38 | 0 | 35 | 7 | 0.2 | 2 |
| 39 | 0 | 35 | 7 | 0.2 | 2 |
| 40 | 0 | 20 | 4 | 0.2 | 2 |
| 41 | 0 | 20 | 4 | 0.2 | 2 |
| 42 | 0 | 20 | 4 | 0.2 | 2 |
| 43 | 0 | 17.5 | 3.5 | 0.2 | 2 |
| 44 | 0 | 17.5 | 3.5 | 0.2 | 2 |
| 45 | 0 | 17.5 | 3.5 | 0.2 | 2 |
| 46 | 0 | 15 | 3 | 0.2 | 2 |
| 47 | 0 | 15 | 3 | 0.2 | 2 |

Table 17 shows plating conditions for the Example Nos. 37 to 47. In this case, the average current density CDm was set at 7 A/dm$^2$ for the Example Nos. 37 to 39, at 4 A/dm$^2$ in the Example Nos. 40 to 42, at 3.5 A/dm$^2$ for the Example Nos. 43 to 45 and at 3 A/dm$^2$ for the Example Nos. 46 and 47. The pH value was varied while keeping the average current density CDm constant as shown in Table 16.

Table 18 shows the crystal shape of the slide surface 4a, the area rate A and average grain size d of the Fe crystals having six ridge lines, the content S of the oriented Fe crystals, and the hardness of the oriented Fe crystals in the Example Nos. 37 to 47, respectively.

TABLE 18

| Example No. | Crystal shape of slide surface | Fe crystals having six ridge lines | | Content S (%) of oriented Fe cyrstals | | | | | Hardness (Hv) |
|---|---|---|---|---|---|---|---|---|---|
| | | Area rate A (%) | Average grain size d (μm) | {110} | {200} | {211} | {310} | {222} | |
| 37 | Hexagonal pyramid | 96 | 5 | 1.2 | 0.5 | 2.2 | 0.3 | 95.8 | 370 |
| | Trigonal pyramid | ≦1 | — | | | | | | |
| 38 | Hexagonal pyramid | 80 | 5 | 1.2 | 1.1 | 8.3 | 1.4 | 88 | 330 |
| | Trigonal Pyramid | 10 | — | | | | | | |
| 39 | Hexagonal pyramid | 5 | 5 | 11.1 | 2.8 | 31.5 | 3.5 | 51.1 | 280 |
| | Trigonal pyramid | 45 | | | | | | | |
| 40 | Hexagonal pyramid | 95 | 3 | 0.5 | 1.1 | 3 | 0.3 | 95.1 | 380 |
| | Trigonal pyramid | ≦1 | — | | | | | | |
| 41 | Hexagonal pyramid | 93 | 3 | 0.8 | 1.2 | 4.5 | 0.8 | 92.7 | 370 |
| | Trigonal pyramid | ≦1 | — | | | | | | |
| 42 | Hexagonal pyramid | 80 | 3 | 0.5 | 0.2 | 13.9 | 0 | 85.4 | 348 |
| | Trigonal pyramid | 5 | — | | | | | | |
| 43 | Hexagonal pyramid | 92 | 2 | 1.0 | 1.5 | 4.6 | 0.8 | 92.1 | 390 |
| | Trigonal pyramid | ≦1 | — | | | | | | |
| 44 | Hexagonal pyramid | 90 | 2 | 1.7 | 2.6 | 4.2 | 1.5 | 90 | 380 |
| | Trigonal pyramid | ≦1 | — | | | | | | |
| 45 | Hexagonal pyramid | 70 | 2 | 3 | 4.1 | 10.7 | 2.7 | 79.5 | 360 |
| | Trigonal pyramid | 10 | — | | | | | | |
| 46 | Hexagonal pyramid | 60 | 2 | 3.8 | 5.6 | 17.3 | 3 | 70.3 | 300 |

TABLE 18-continued

| Example No. | Crystal shape of slide surface | Fe crystals having six ridge lines | | Content S (%) of oriented Fe cyrstals | | | | | Hardness (Hv) |
|---|---|---|---|---|---|---|---|---|---|
| | | Area rate A (%) | Average grain size d (μm) | {110} | {200} | {211} | {310} | {222} | |
| 47 | Trigonal pyramid | 10 | — | | | | | | |
| | Hexagonal pyramid | 40 | 2 | 5 | 6.8 | 18.6 | 4.6 | 65 | 295 |
| | Trigonal pyramid | 25 | — | | | | | | |

Figure 26:
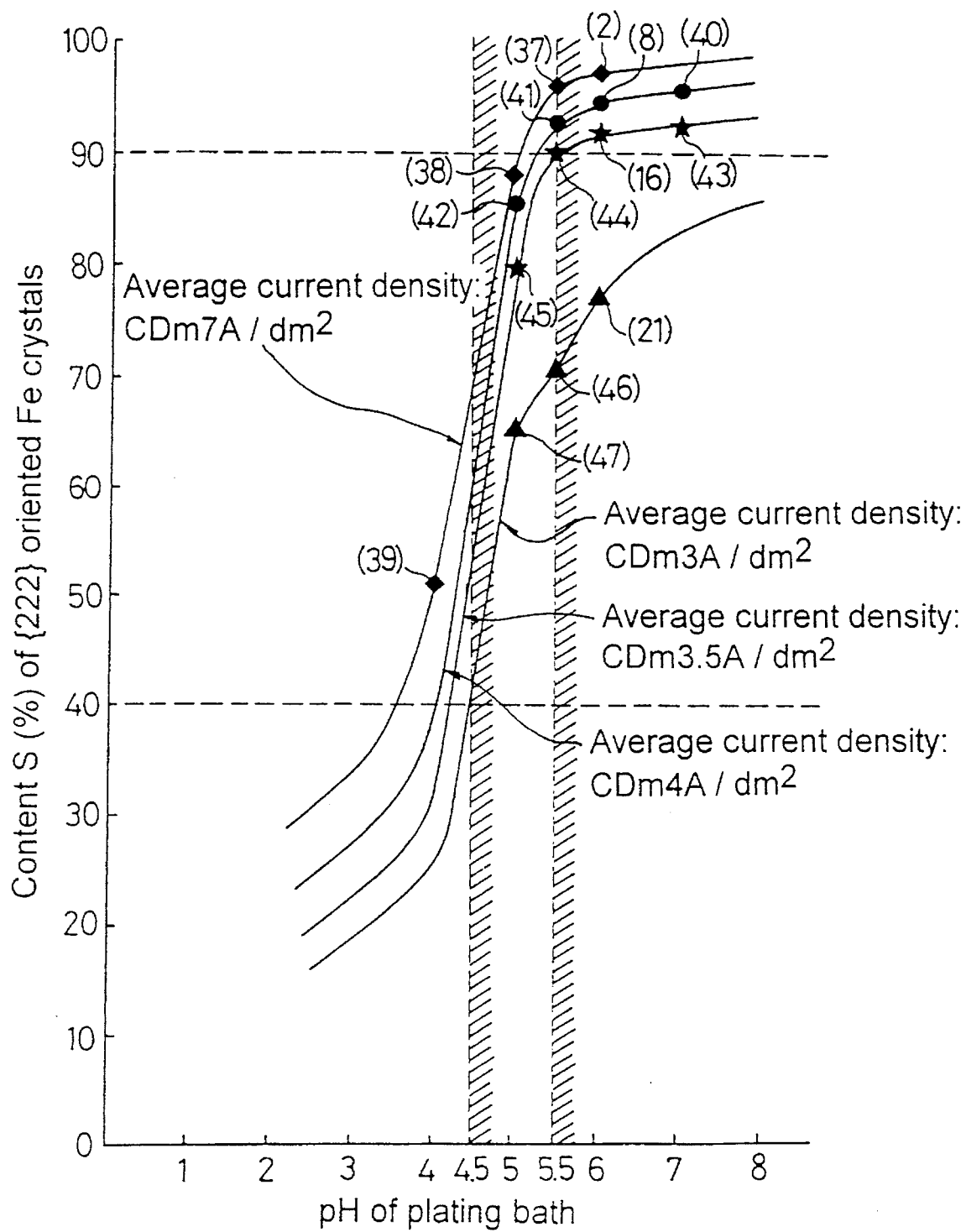
FIG. 26 is a graph illustrating the relationship between the pH of the plating bath and the content S of the (222) oriented Fe crystals.

FIG. 26 shows the relationship between the pH value of the plating bath and the content S of the {222} oriented Fe crystals in the Example Nos. 37 to 47 and the above-described Example Nos. 2, 8, 16 and 21. In FIG. 26, points (2), (8), (16), (21) and (37) to (47) correspond to the Example Nos. 2, 8, 16, 21 and 37 to 47, respectively. As apparent from FIG. 26, the content S of the {222} oriented Fe crystals can be set in a range of S≧40% by setting the pH value in a range of pH≧4.5, for example, at an average current density CDm≧3 A/dm². In order to set the content S of the {222} oriented Fe crystals in a range of S≧90%, it is necessary to set the pH value in a range of pH≧5.5 at an average current density CDm≧3.5 A/dm².

(d) (d) With regard to seizure and wear resistance:

A seizure test was carried out in a chip-on-disk manner with lubrication for the Example Nos. 1, 7, 8, 11 to 14, 22 to 24 and 31 of the slide surface constructions 4 to determine the relationship between the content S of the {222} oriented Fe crystals and the seizure generating load. Test conditions were as follows: the material of the disk was Al-10% by weight of Si alloy; the rotational speed of the disk was 15 m/sec.; the amount of oil supplied was 0.3 ml/min.; and the area of the slide surface of the chip made from the slide construction was 1 cm².

A wear test was also carried out in a chip-on-disk manner with lubrication for the Example Nos. 1, 7, 8, 11 to 14, 17, 22 to 24 and 31 to determine the relationship between the content S of the {222} oriented Fe crystals and the wear amount of the chip. Test conditions were as follows: the material of the disk was an Al-10% by weight of Si alloy; the rotational speed of the disk was 0.5 m/sec.; the load was 100N; the slide distance was 1 km; and the area of the slide surface of the chip made from the slide construction was 1 cm². The wear amount of the chip is decrement (mg) per area (1 cm²) of the chip.

Figure 27:
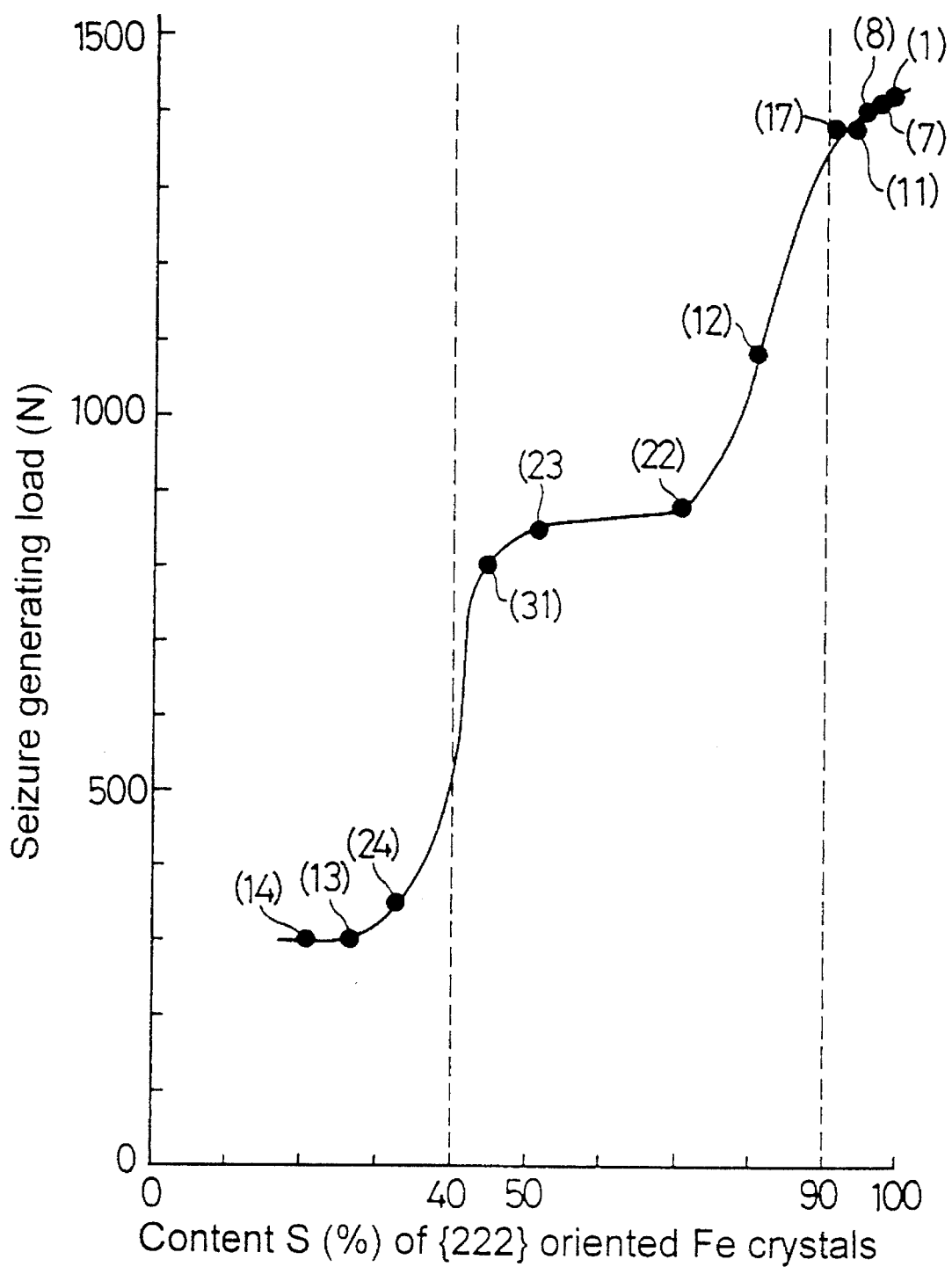
FIG. 27 is a graph illustrating the relationship between the content S of the (222) oriented Fe crystals and the seizure generating load.
Figure 28:
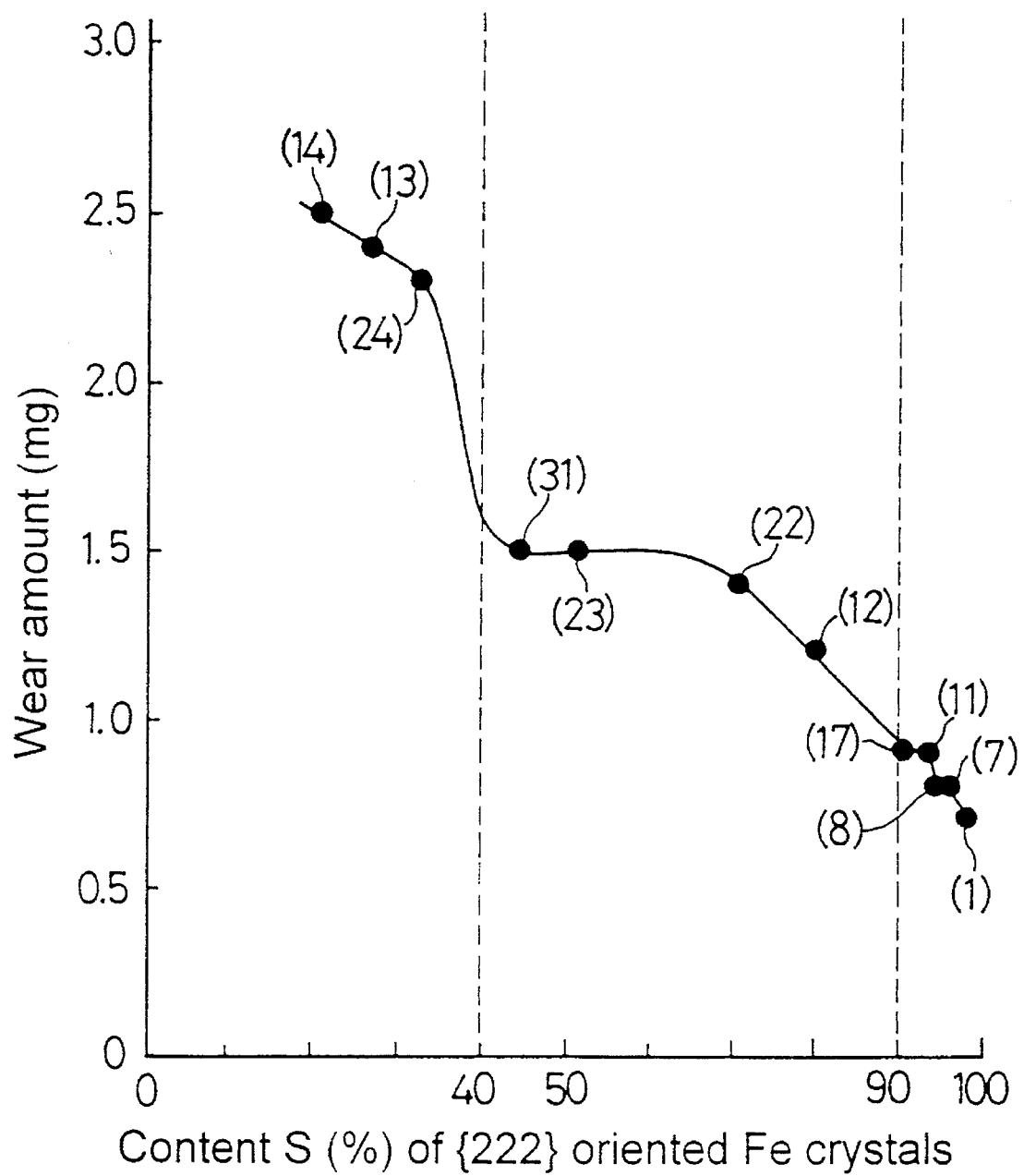
FIG. 28 is a graph illustrating the relationship between the content S of the (222) oriented Fe crystals and the wear amount.

Table 19 shows the results of the seizure and wear tests. FIGS. 27 and 28 are graphs taken from Table 19. In both FIGS. 27 and 28, points (1), (7), (8), (11) to (14), (17), (22) to (24) and (31) correspond to the Example Nos. 1, 7, 8, 11 to 14, 17, 22 to 24 and 31, respectively.

TABLE 19

| Example No. | Content S (%) of {222} oriented Fe crystals | Seizure generating load (N) | Wear amount (mg) |
|---|---|---|---|
| 1 | 98 | 1420 | 0.7 |
| 7 | 95.9 | 1410 | 0.8 |
| 8 | 94.3 | 1400 | 0.8 |
| 11 | 93.5 | 1380 | 0.9 |
| 12 | 80.1 | 1080 | 1.2 |
| 13 | 26.4 | 300 | 2.4 |

TABLE 19-continued

| Example No. | Content S (%) of {222} oriented Fe crystals | Seizure generating load (N) | Wear amount (mg) |
|---|---|---|---|
| 14 | 20.3 | 300 | 2.5 |
| 17 | 90.6 | 1380 | 0.9 |
| 22 | 70.3 | 880 | 1.4 |
| 23 | 51.1 | 850 | 1.5 |
| 24 | 32.3 | 350 | 2.3 |
| 31 | 44.5 | 800 | 1.5 |

As is apparent from Table 19 and FIG. 27, when the content S of the {222} oriented Fe crystals is in a range of S≧40%, the slide surface 4a has a good oil retention and a good initial conformability and hence, the seizure resistance is increased considerably. It is apparent that particularly when the content S of the {222} oriented Fe crystals is in a range of S≧90%, the seizure resistance is increased drastically due to an increase in density of the Fe crystals having six ridge lines.

In addition, as apparent from Table 19 and FIG. 28, when the content S of the {222} oriented Fe crystals is in a range of S≧40%, the wear amount of the chip becomes smaller and therefore, even without lubrication, a good wear resistance is obtained. Particularly when the content S of the {222} oriented Fe crystals is in a range of S≧90%, the seizure resistance is extremely good due to an increase in density of the Fe crystals having six ridge lines.

GROUP-B

Although the minimum current density CDmin has been set at 0 (zero) A/dm² in the above-described Group-A, the minimum current density CDmin is set in a range of CDmin≧0.2 A/dm² or in a range of CDmin≦−0.2 A/dm₂ in this Group-B.

Table 20 shows plating conditions for Example Nos. 1 to 7 of slide surface constructions. It should be noted that the Example No. 4 is the same as the Example 8 in Group-A.

TABLE 20

| Example No. | Plating bath conditions | | | |
|---|---|---|---|---|
| | Concentration of ferrous sulfate (g/liter) | Concentration of Fe²⁺ ions (mol/liter) | pH | Temperature (°C.) |
| 1~7 | 400 | 1.4 | 6 | 50 |

Table 21 shows plating conditions in the Example Nos. 1 to 7.

TABLE 21

| Example No. | Treating conditions of plating | | | | |
|---|---|---|---|---|---|
| | Minimum current density CDmin (A/dm$^2$) | Maximum current density CDmax (A/dm$^2$) | Average current density CDm (A/dm$^2$) | Time ratio $T_{ON}/T_C$ | Output time $T_{ON}$ (msec) |
| 1 | −1 | 24 | 4 | 0.2 | 2 |
| 2 | −0.5 | 22 | 4 | 0.2 | 2 |
| 3 | −0.2 | 21 | 4 | 0.2 | 2 |
| 4 | 0 | 20 | 4 | 0.2 | 2 |
| 5 | 0.2 | 19 | 4 | 0.2 | 2 |
| 6 | 0.5 | 18 | 4 | 0.2 | 2 |
| 7 | 1 | 16 | 4 | 0.2 | 2 |

Table 22 shows the crystal shape of the slide surface 4a, the area rate A and average grain size d of the Fe crystals having six ridge lines, and the content S of the oriented Fe crystals, and hardness of the oriented Fe crystals in the Example Nos. 1 to 7, respectively.

Figure 29:
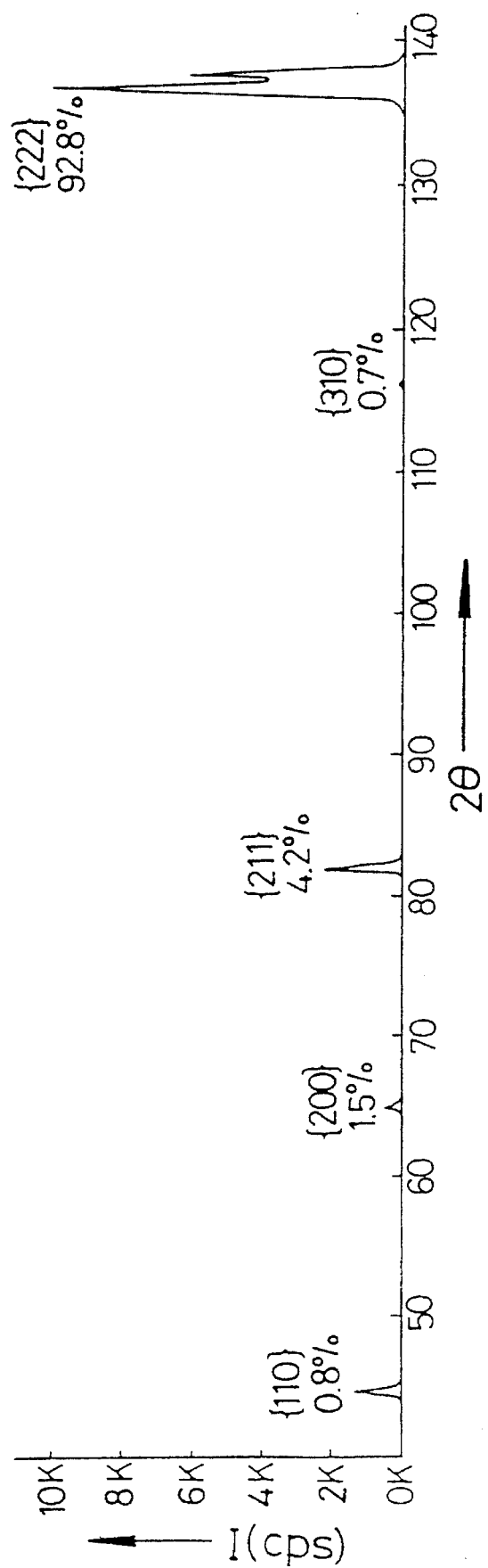
FIG. 29 is an X-ray diffraction pattern for a slide surface construction.
Figure 30:
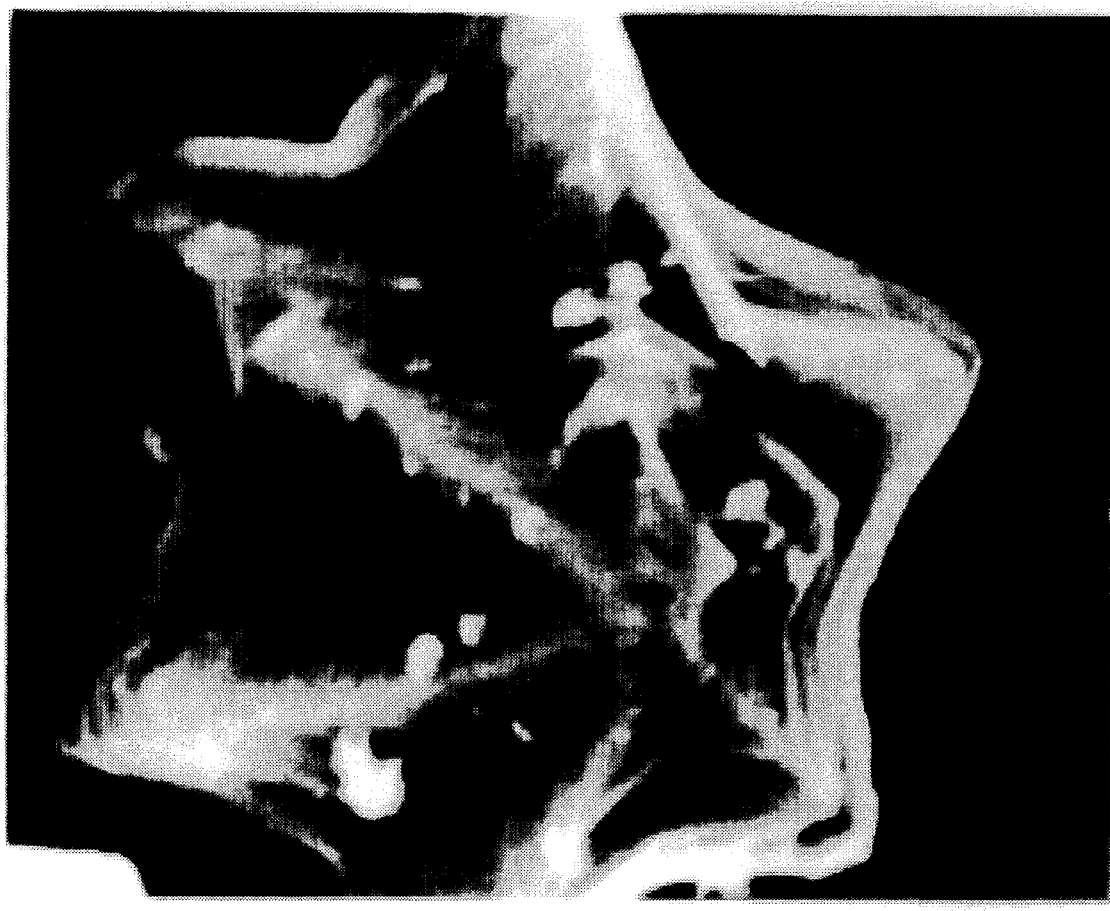
FIG. 30 is a photomicrograph showing a crystal structure of a slide surface of the slide surface construction.

FIG. 29 is an X-ray diffraction pattern for the Example No. 1, and FIG. 30 is an electronic photomicrograph showing a crystal structure of a slide surface 4a in the Example No. 1. As apparent from FIG. 30, if the minimum current density CDmin is set in a range CDmin≦−0.2 A/dm$^2$, the {222} oriented Fe crystals are Fe crystals having six ridge lines having relatively deep valleys between the adjacent ridge lines.

Figure 31:
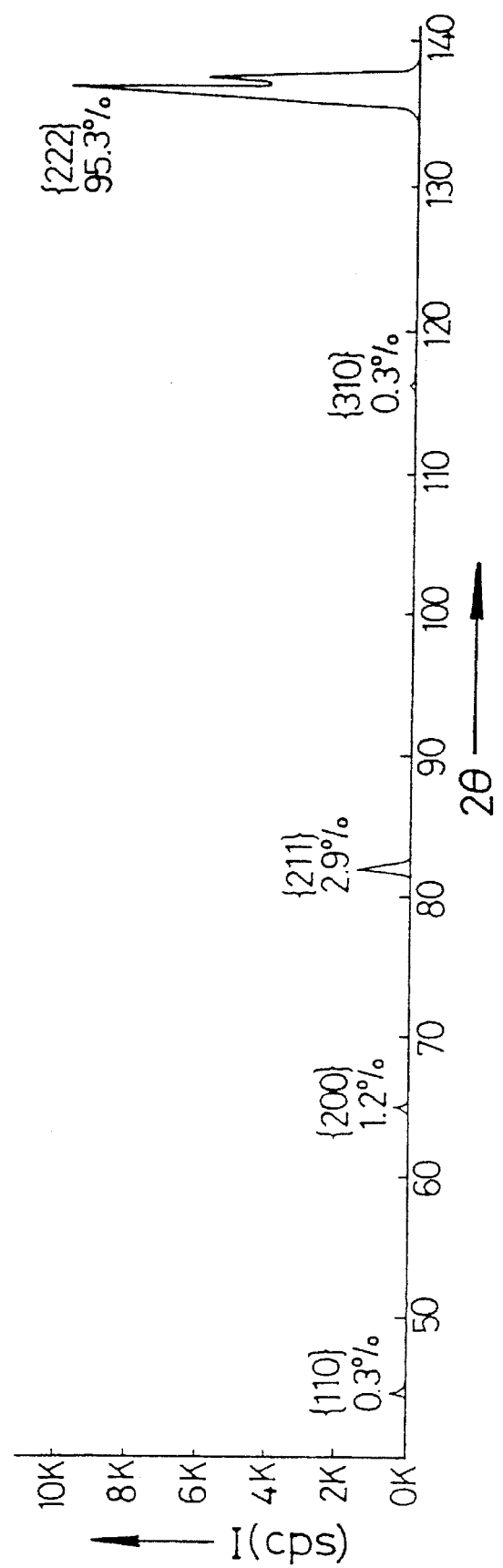
FIG. 31 is an X-ray diffraction pattern for a slide surface construction.
Figure 32:
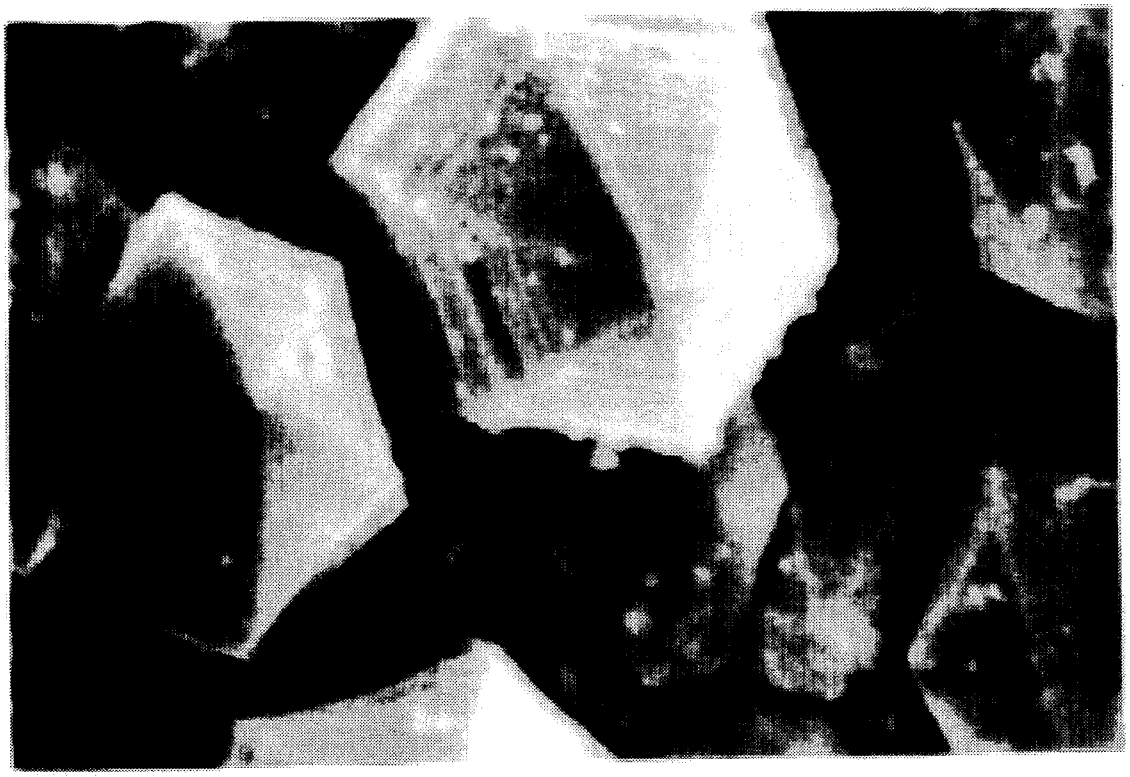
FIG. 32 is a photomicrograph showing a crystal structure of a slide surface of the slide surface construction.

FIG. 31 is an X-ray diffraction pattern for the Example No. 7, and FIG. 32 is an electronic photomicrograph showing a crystal structure of the slide surface 4a in the Example No. 7. As apparent from FIG. 32, if the minimum current density CDmin is set in a range of CDmin≧0.2 A/dm$^2$, the {222} oriented Fe crystals are Fe crystals and six ridge lines having substantially flat slants between adjacent ridge lines.

Figure 33:
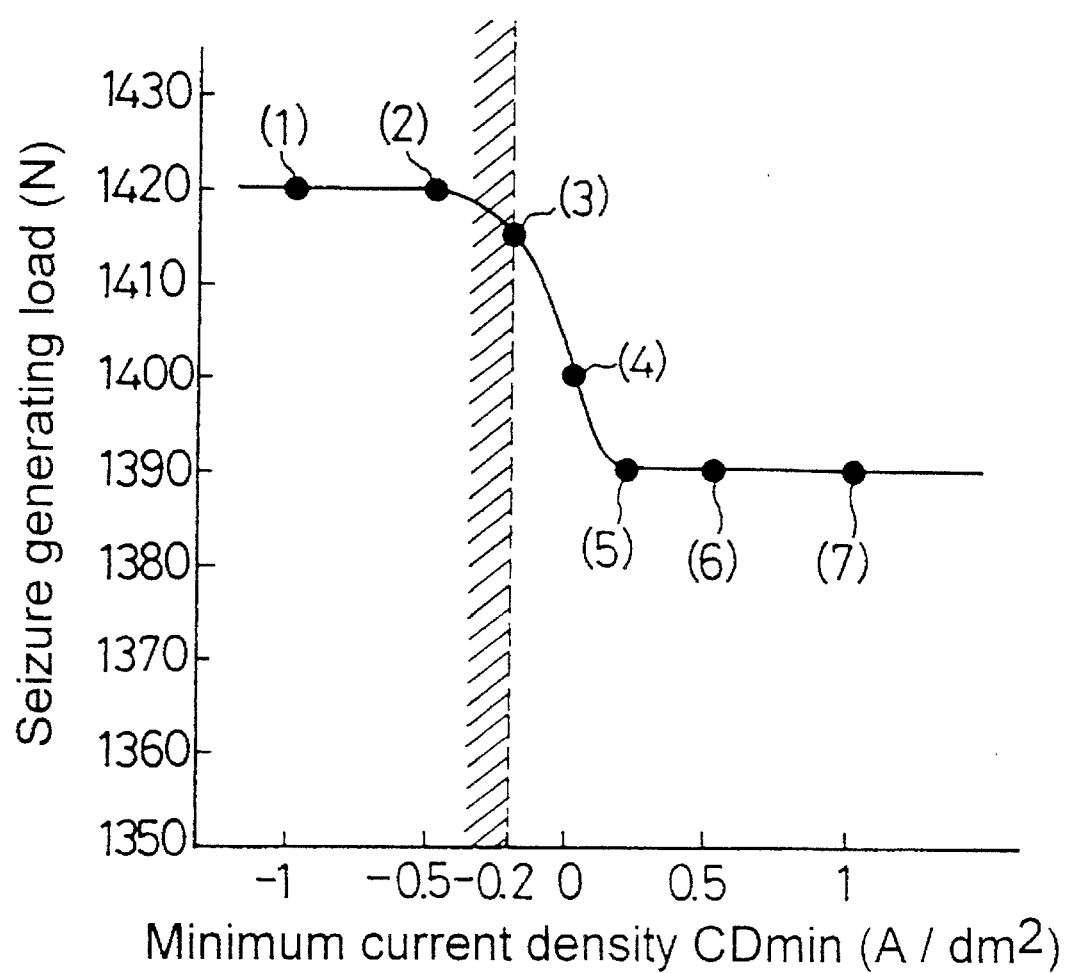
FIG. 33 is a graph illustrating the relationship between the minimum current density CDmin and the seizure generating load.
Figure 34:
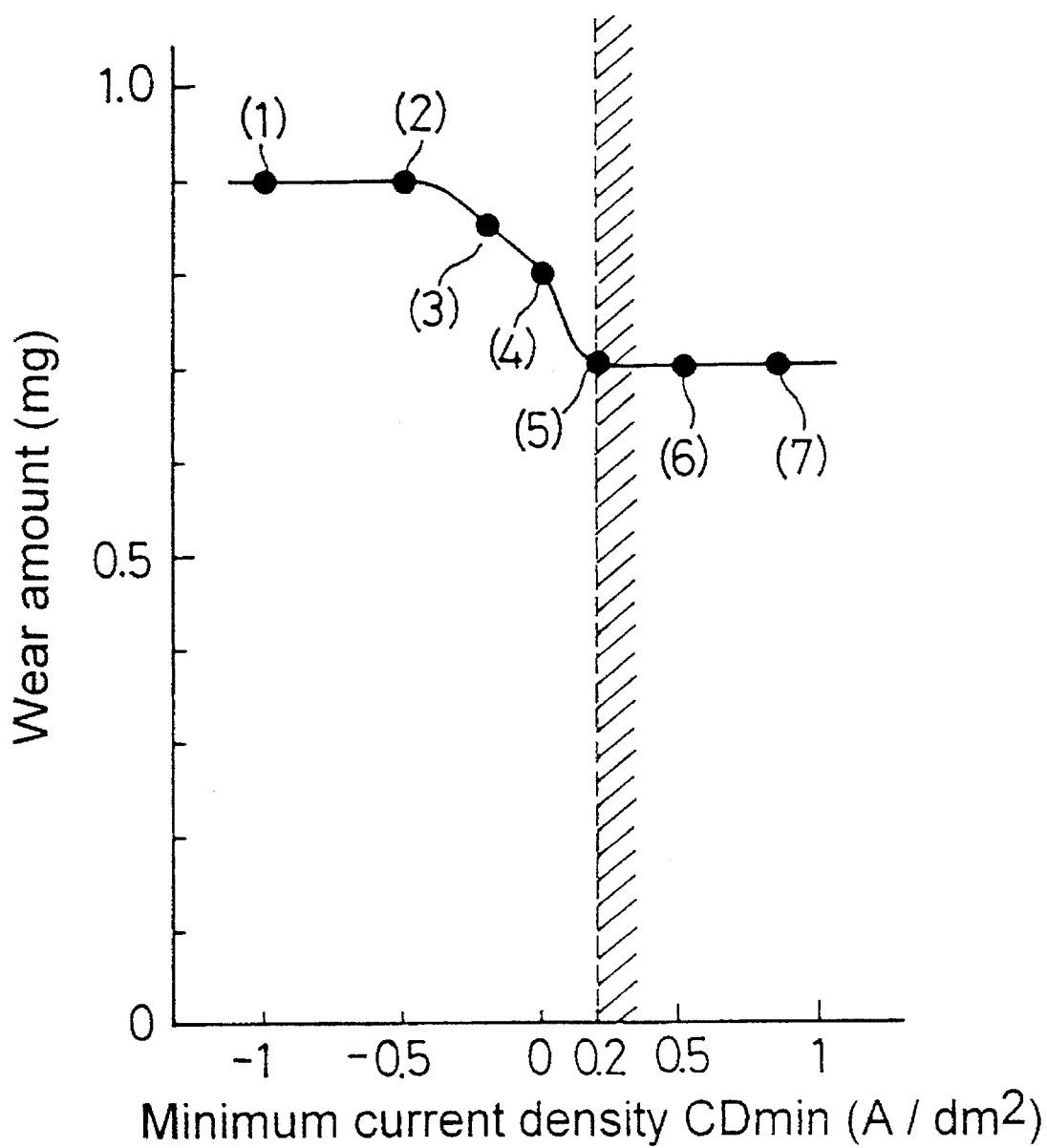
FIG. 34 is a graph illustrating the relationship between the minimum current density CDmin and the wear amount.

A seizure test with lubrication and a wear test without lubrication for the Example Nos. 1 to 7 were carried out under the same conditions as those described above to provide results given in Table 23. FIGS. 33 and 34 are graphs taken from Table 23, wherein points (1) to (7) correspond to the Example Nos. 1 to 7.

TABLE 23

| Example No. | Content S (%) of {222} oriented Fe crystals | Seizure generating load (N) | Wear amount (mg) |
|---|---|---|---|
| 1 | −1 | 1420 | 0.9 |
| 2 | −0.5 | 1420 | 0.9 |
| 3 | −0.2 | 1415 | 0.85 |

TABLE 22

| Example No. | Crystal shape of slide surface | Fe crystals having six ridge lines | | Content S (%) of oriented Fe cyrstals | | | | | Hardness (Hv) |
|---|---|---|---|---|---|---|---|---|---|
| | | Area rate A (%) | Average grain size d (μm) | {110} | {200} | {211} | {310} | {222} | |
| 1 | Hexagonal pyramid | 95 | 6 | 0.8 | 1.5 | 4.2 | 0.7 | 92.8 | 370 |
| | Trigonal pyramid | ≦1 | — | | | | | | |
| 2 | Hexagonal pyramid | 93 | 6 | 0.8 | 1.7 | 3.7 | 0.7 | 93.1 | 370 |
| | Trigonal pyramid | ≦1 | — | | | | | | |
| 3 | Hexagonal pyramid | 94 | 5 | 0.7 | 1.6 | 3.5 | 0.7 | 93.5 | 375 |
| | Trigonal pyramid | ≦1 | — | | | | | | |
| 4 | Hexagonal pyramid | 96 | 3 | 0.5 | 1.2 | 3.3 | 0.7 | 94.3 | 380 |
| | Trigonal pyramid | ≦1 | — | | | | | | |
| 5 | Hexagonal pyramid | 95 | 5 | 0.4 | 1.4 | 3.2 | 0.4 | 94.6 | 400 |
| | Trigonal pyramid | ≦1 | — | | | | | | |
| 6 | Hexagonal pyramid | 96 | 6 | 0.3 | 1.3 | 2.9 | 0.4 | 95.1 | 400 |
| | Trigonal pyramid | ≦1 | — | | | | | | |
| 7 | Hexagonal pyramid | 97 | 6 | 0.3 | 1.2 | 2.9 | 0.3 | 95.3 | 400 |
| | Trigonal pyramid | ≦1 | — | | | | | | |

TABLE 23-continued

| Example No. | Content S (%) of {222} oriented Fe crystals | Seizure generating load (N) | Wear amount (mg) |
| --- | --- | --- | --- |
| 4 | 0 | 1400 | 0.8 |
| 5 | 0.2 | 1390 | 0.7 |
| 6 | 0.5 | 1390 | 0.7 |
| 7 | 1 | 1390 | 0.7 |

As is apparent from Table 23 and FIG. 33, if the minimum current density CDmin is set in a range CDmin≧−0.2 A/dm$^2$, each Fe crystal having six ridge lines has an Improved oil retention due to each valley portion thereof and hence, has an enhanced seizure resistance as in the Example Nos. 1 to 3.

As is apparent from Table 23 and FIG. 34, if the minimum current density CDmin is set in a range CDmin≧0.2 A/dm$^2$, each Fe crystal having six ridge lines has an increased hardness and hence, has an enhanced wear resistance.

GROUP-C

Figure 35:
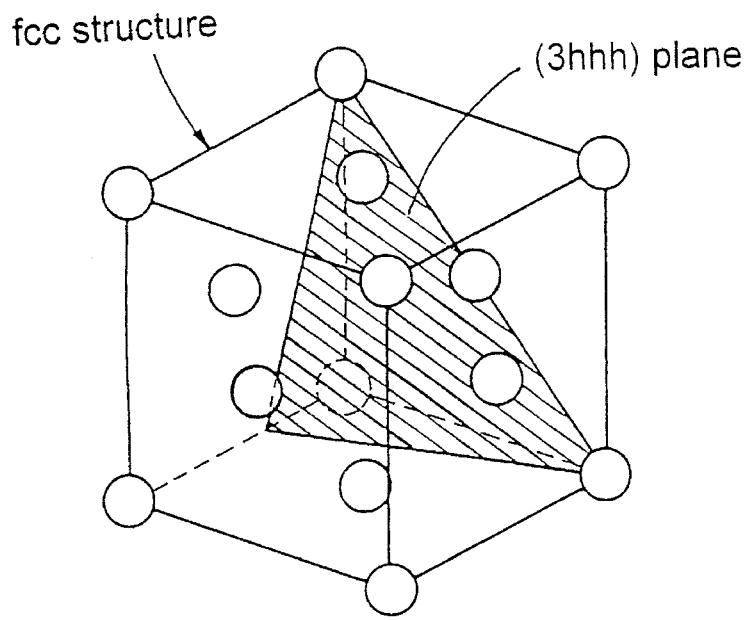
FIG. 35 is a perspective view illustrating a face-centered cubic structure and its (3hhh) plane.
Figure 36:
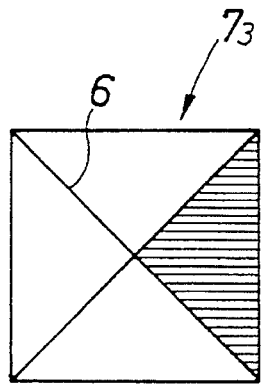
FIG. 36 is a plan view of a metal crystal having four ridge lines.

As shown in FIG. 35, the slide surface construction 4 may be formed of an aggregate of metal crystals having a face-centered cubic structure (which will be referred to as an fcc structure). The aggregate includes (3hhh) oriented metal crystals grown into a columnar form from a base material 2 with their (3hhh) planes (by Miller indices) oriented toward a slide surface 4a, wherein the content S of the (3hhh) oriented metal crystals is set in a range S≧40%. As shown in FIG. 36, the (3hhh) oriented metal crystal is a metal crystal of a quadrangular pyramid (or truncated quadrangular pyramid) shape in the slide surface 4a, i.e., a metal crystal $7_3$ having four ridge lines $6_3$.

Figure 37:
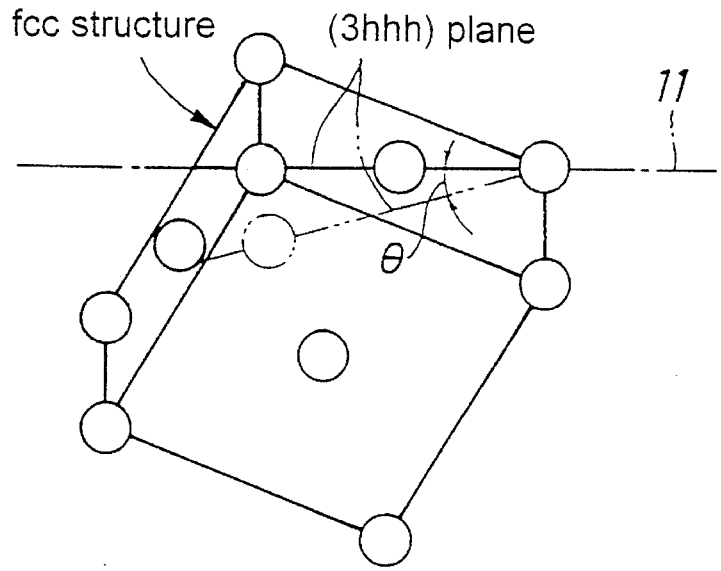
FIG. 37 is a diagram illustrating an inclination of the (3hhh) plane in a face-centered cubic structure.

As shown in FIG. 37, the inclination of the (3hhh) plane with respect to a phantom plane 11 extending along the slide surface 4a appears as an inclination of the quadrangular pyramid and therefore, an influence is imparted to the oil retention and the initial conformability of the slide surface construction 4. Preferably, the inclination angle θ formed by the (3hhh) plane with respect to the phantom plane 11 is set in a range represented by 0°≦θ15° for the same reason as that described above. In this case, the direction of inclination of the (3hhh) plane is not limited.

Metal crystals having the fcc structure includes those of simple metals such as Pb, Ni, Cu, Pt, Al, Ag, Au and the like and alloys thereof, particular examples of which now will be described below.

Cam shafts for internal combustion engines were produced by subjecting the outer peripheral surfaces of a base material of a cast iron to an electrolytic Ni-plating to form a slide surface construction 4 comprised of an aggregate of Ni crystals. Plating bath conditions were as follows: the concentration (Ni$^{2+}$) of Ni ions (Ni$^{2°}$) was 1 mol/liter; the pH was 5.5 and the temperature was 55° C. Plating conditions were as follows: the minimum current density CDmin was 0 A/dm$^2$; the maximum current density CDmax was 20 A/dm$^2$; the average current density CDm was 4 A/dm$^2$; the time ratio $T_{ON}/T_C$ was 0.2; and the output time $T_{ON}$ was 2 msec.

The resultant slide surface was of a combined quadrangular pyramid/granular shape, wherein the area rate A of Ni crystals having four ridge lines was 60% and the average grain size d of the Ni crystals having four ridge lines was 4 µm; the content S of {111} oriented Ni crystals was 29%; the content S of {222} oriented Ni crystals was 15.2%; the content S of {220} oriented Ni crystals was 4.7%; and the content of {311} oriented Ni crystals was 51.1%; and the hardness Hv was 250.

Figure 38:
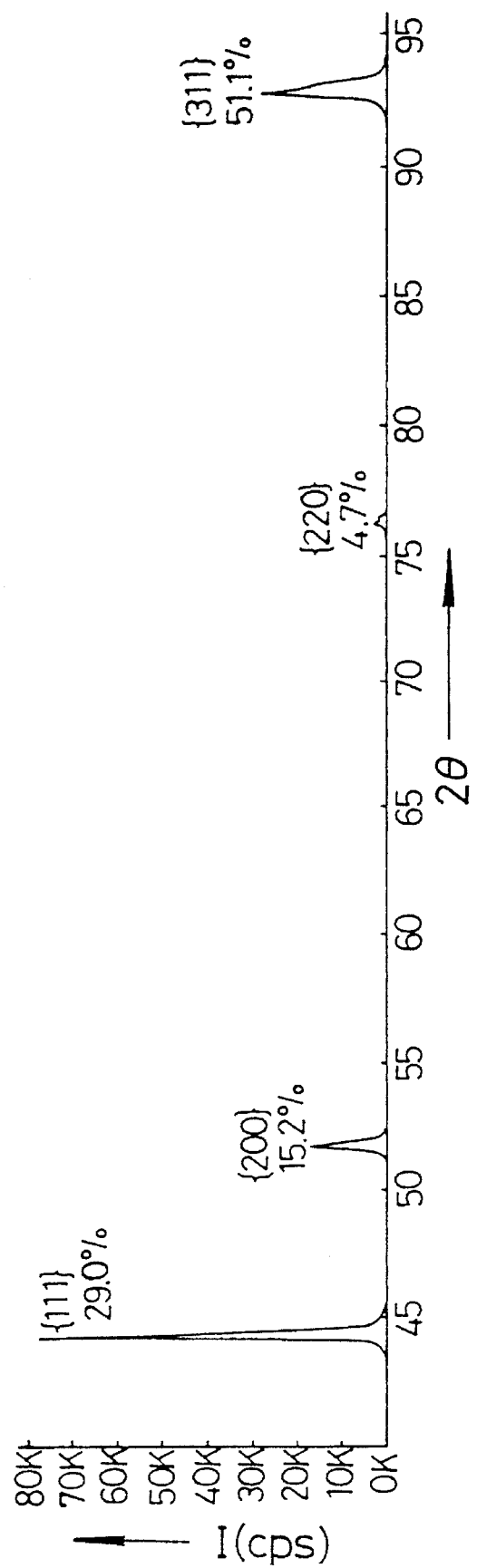
FIG. 38 is an X-ray diffraction pattern for a slide surface construction.

The contents S were determined from the following expressions on the basis of an X-ray diffraction pattern (the X-ray was applied in a direction perpendicular to the slide surface) of a slide surface construction shown in FIG. 38. For example, the term "{111} oriented Ni crystal" means an oriented Ni crystal with its {111} plane oriented toward the slide surface.

{111} oriented Ni crystal: $S_{111}=((I_{111}/IA_{111})/T)\times100$
{200} oriented Ni crystal: $S_{200}=((I_{200}/IA_{200})/T)\times100$
{220} oriented Ni crystal: $S_{220}=((I_{220}/IA_{220})/T)\times100$
{311} oriented Ni crystal: $S_{311}=((I_{311}/IA_{311})/T)\times100$
wherein each of $I_{111}$, $I_{200}$, $I_{220}$ and $I_{311}$ is a measurement (cps) of intensity of X-ray reflected from each crystal plane, $I_{111}=78.6K$, $I_{200}=17.4K$, $I_{220}=2.7K$, and $I_{311}=27.7K$, and each of $IA_{111}$, $IA_{200}$, $IA_{220}$ and $IA_{311}$ is an intensity ratio of X-ray reflected from each crystal plane in an ASTM card, $IA_{111}=100$, $IA_{200}=42$, $IA_{200}=21$ and $IA_{311}=20$. Hence, $T=(I_{111}/IA_{111})+(I_{200}/IA_{200})+(I_{220}/IA_{220})+(I_{311}/IA_{311})= 2.71K$.

Figure 39:
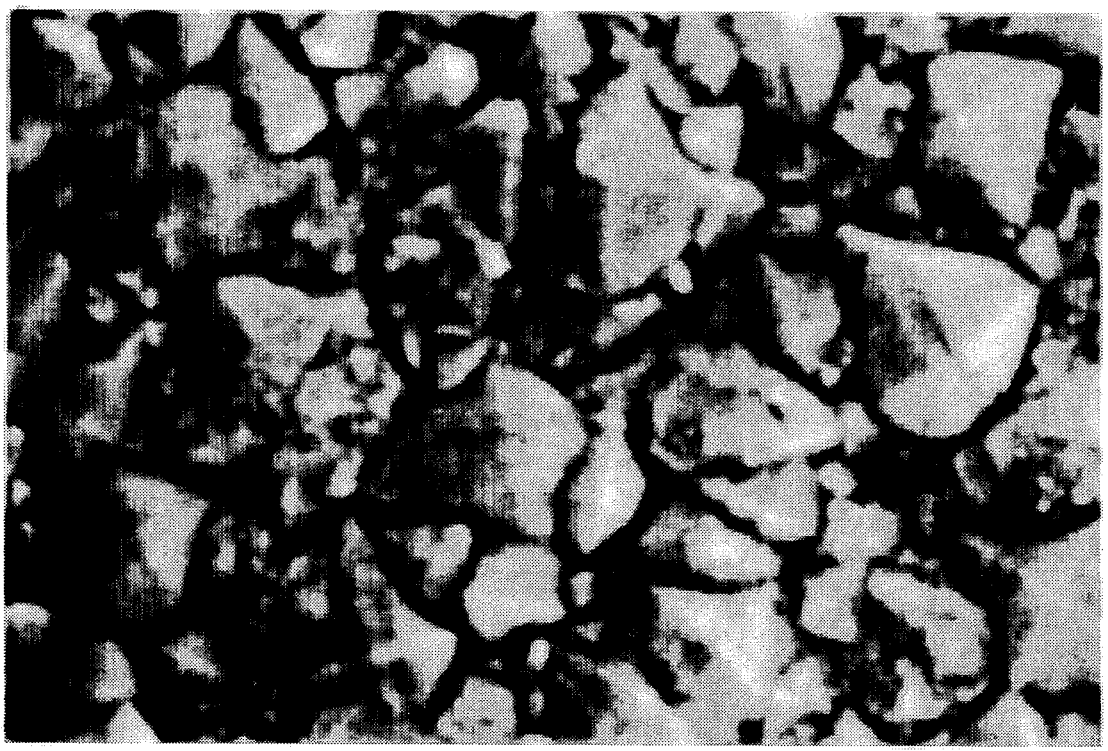
FIG. 39 is a photomicrograph showing a crystal structure of a slide surface of the slide surface construction.

FIG. 39 is a photomicrograph showing a crystal structure of the slide surface. In FIG. 39, a large number of quadrangular pyramid-shaped Ni crystals having four ridge lines are observed. This Ni crystal having four ridge lines is a {311} oriented Ni crystal with its (3hhh) plane, i.e., {311} plane oriented toward the slide surface, and has a content S equal to 51.1%.

A seizure test with lubrication and a wear test without lubrication were carried out for this slide surface construction under the same conditions as those described above. The results showed that seizure generating load was 650N and the wear amount was 1.6 mg.

In the (hhh) oriented metal crystals having the body-centered cubic structure, i.e., the metal crystals having three or six ridge lines, the crystal shape in the slide surface, the crystal planes present in each slant and the like are as given in Table 24.

TABLE 24

Figure 40:
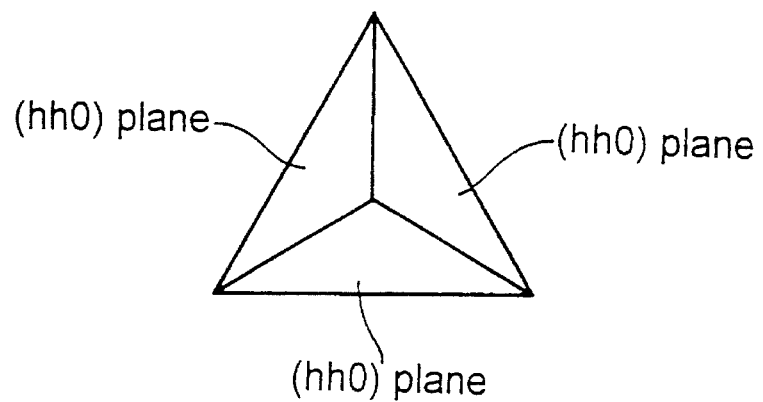
FIG. 40 is a plan view illustrating crystal planes present in slants of a metal crystal having three ridge lines.
Figure 41:
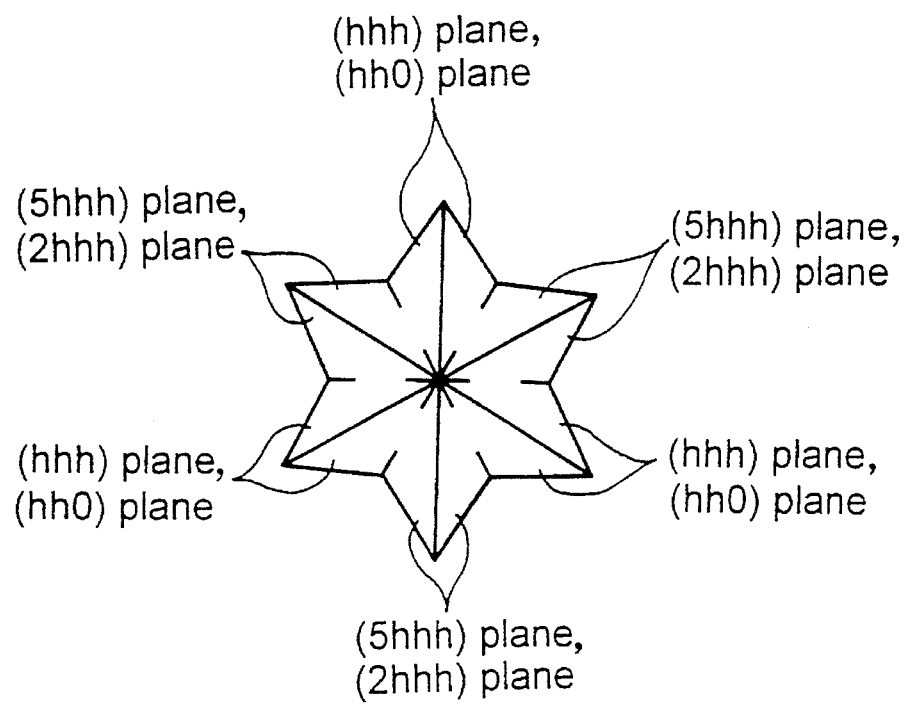
FIG. 41 is a plan view illustrating crystal planes present in slants in one example of a metal crystal having six ridge lines.
Figure 42:
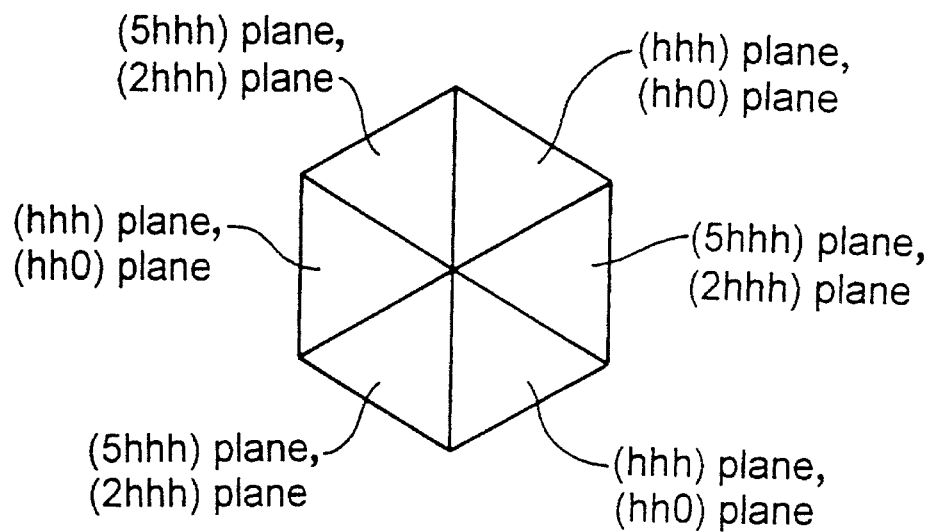
FIG. 42 is a plan view illustrating crystal planes present in slants in another example of a metal crystal having six ridge lines.

| Crystal shape in slide surface | Crystal plane present in each slant | Characteristic of slant | Referential drawing |
| --- | --- | --- | --- |
| Triangular pyramid | (hh0) plane-close-packed plane | High hardness, good wettability and wear resistance | FIG. 40 |
| Hexangular Pyramid | (hhh) plane: 50% (5hhh) plane: 50 | Excellent wettability due to (hhh) plane having a large surface energy | FIG. 41: slant having deep valleys |
| | (hh0) plane: 50% (2hhh) plane: 50% (hh0) plane-close-packed plane | High hardness, good wettability and wear resistance | FIG. 42: flat slant |

In the (3hhh) oriented metal crystals having the face-centered cubic structure, i.e., the metal crystals having four ridge lines, the crystal shape in the slide surface, the crystal planes present in each slant and the like are as given in Table 25.

TABLE 25

Figure 43:
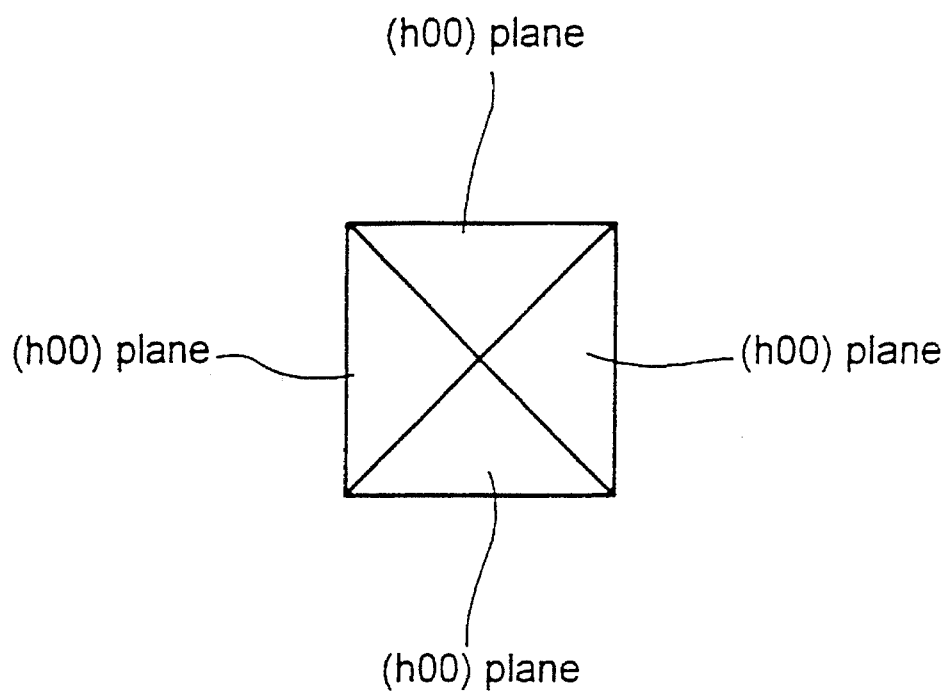
FIG. 43 is a plan view illustrating crystal planes present in slants in one example of a metal crystal having four ridge lines.

| Crystal shape in slide surface | Crystal plane present in each slant | Characteristic of slant | Referential drawing |
| --- | --- | --- | --- |
| Quadrangular pyramid | (h00) plane-plane having high atom density | Good wettability and wear resistance | FIG. 43 |

In a slide surface construction formed of an aggregate of metal crystals having an fcc structure, when the aggregate includes a large number of (hhh) oriented metal crystals with their (hhh) planes (by Miller indices) oriented toward the slide surface, at least some of the (hhh) oriented metal crystals can be formed into metal crystals having six ridge lines similar to those described above in the slide surface. The (hhh) oriented metal crystals may be {111} oriented Ni crystals, when Ni is used.

The slide surface construction of this invention is applicable, for example, to a slide portion of any of following parts for internal combustion engines: pistons (ring grooves), piston rings, piston pins, connecting rods, crank shafts, bearing metals, oil pump rotors, oil pump rotor housings, cam shafts, springs (end faces), spring seats, spring retainers, cotters, rocker arms, roller bearing outer cases, roller bearing inner cases, valve stems, valve faces, hydraulic tappets, water pump rotor shafts, pulleys, gears, transmission shaft portions, clutch plates, washers, and bolts (bearing surfaces and threaded portions).

It will be understood that the present invention is not limited to the formation of the slide surface construction and is applicable to the formation of a light absorbing member utilizing an absorbance of a skin film having metal crystals of the type described above, the formation of a magnetic shield material utilizing a high permeability of the skin film, the formation of a primary coat and the like. In this case, the light absorbing members embrace a light absorbing film used for an infrared laser processing, a light receiving plate in a heat exchanger utilizing a solar heat, a reflection preventing film in a solar cell, and the like. The primary coats embrace those formed on an outer surface of a cast-in insert member, a coating surface of a member, and the like.

Further, the material for forming the skin film are not limited to the described metals, and an inorganic skin film may be formed of ceramics such as carbonates, oxides, nitrides, etc., having a cubic crystal structure.

What is claimed is

1. An inorganic skin film formed of an aggregate of three dimensional crystals having a cubic crystal structure, at least some of said three dimensional crystals being hexangular pyramid-shaped crystals or truncated hexangular pyramid-shaped crystals having six ridge lines projecting from the surface of the skin film.

2. An inorganic skin film formed of an aggregate of metal crystals, said aggregate including three dimensional (hhh) oriented metal crystals having a cubic crystal structure with their (hhh) planes (by Miller indices) oriented toward the skin film surface, at least some of said three dimensional (hhh) oriented metal crystals being hexangular pyramid-shaped metal crystals or truncated hexangular pyramid-shaped metal crystals having six ridge lines projecting from the surface of the skin film.

3. An inorganic skin film formed of an aggregate of metal crystals, said aggregate including (hhh) oriented metal crystals having a cubic crystal structure with their (hhh) planes (by Miller indices) oriented toward the skin film surface, at least some of said (hhh) oriented metal crystals being hexangular pyramid-shaped metal crystals or truncated hexangular pyramid-shaped metal crystals having six ridge lines in the skin film surface, wherein the area rate A of said metal crystals having six ridge lines in said skin film surface is in a range of $A \geq 60\%$.

4. An inorganic skin film according to claim 3, wherein the average grain size d of said metal crystals having six ridge lines is in a range of $d \leq 3$ μm.

5. An inorganic skin film according to claim 4, wherein the content S of said (hhh) oriented metal crystals is in a range of $S \geq 90\%$.

6. An inorganic skin film according to claim 3, wherein the content S of said (hhh) oriented metal crystals is in a range of $S \geq 90\%$.

7. An inorganic skin film formed of an aggregate of metal crystals, said aggregate including (hhh) oriented metal crystals having a cubic crystal structure with their (hhh) planes by Miller indices) oriented toward the skin film surface, at least some of said (hhh) oriented metal crystals being hexangular pyramid-shaped metal crystals or truncated hexangular pyramid-shaped metal crystals having six ridge lines in the skin film surface, wherein the average grain size d of said metal crystals having six ridge lines is in a range of $d \geq 3$μm.

8. An inorganic skin film according to claim 7, wherein the content S of said (hhh) oriented metal crystals is in a range of $S \geq 90\%$.

9. An inorganic skin film formed of an aggregate of metal crystals, said aggregate including (hhh) oriented metal crystals having a cubic crystal structure with their (hhh) planes (by Miller indices) oriented toward the skin film surface, at least some of said (hhh) oriented metal crystals being hexangular pyramid-shaped metal crystals or truncated hexangular pyramid-shaped metal crystals having six ridge lines in the skin film surface, wherein the content S of said (hhh) oriented metal crystals is in a range of $S \geq 90\%$.

\* \* \* \* \*

UNITED STATES PATENT AND TRADEMARK OFFICE
CERTIFICATE OF CORRECTION

PATENT NO.  : 5,503,942
DATED       : April 2, 1996
INVENTOR(S) : Masamune Tabata, et al.

It is certified that error appears in the above-identified patent and that said Letters Patent is hereby corrected as shown below:

Column 2,
Line 26, insert --of-- after "range".
Line 30, insert --of-- after "range".

Column 3,
Lines 45, 48, and 51, change "(222)" to read --{222}--.

Column 5,
Line 52, change "$A/dm^2 \geq$" to read --$A/dm^2 \leq$--.

Column 8,
Line 49, change "$S_{310}$" to read $S_{222}$--.
Line 54, change $IA_{200}$ --=20" to read $IA_{200}$=20--.

Column 10,
Line 8, change "or equal to" to read --equal to or--.

Column 12,
Line 23, change "$T_c \geq 0.35$" to read --$T_c \leq 0.35$--.
Line 65, delete first "(a)".

Column 17,
Line 32, change "$I_{200} \geq 1.7K$" to read -- $I_{211}=1.7K$--.
Line 44, change "the oriented" to read --the {222} oriented--.
Line 62, change "ms" to read --is--.
Line 62, change "range S" to read --range of S--.
Line 62, change "$90 \leq S \geq$" to read --$90 \leq S \leq$--.

Column 18,
Line 51, before "current" insert --average--.

UNITED STATES PATENT AND TRADEMARK OFFICE
CERTIFICATE OF CORRECTION

PATENT NO.    : 5,503,942
DATED         : April 2, 1996
INVENTOR(S)   : Masamune Tabata, et al.

It is certified that error appears in the above-identified patent and that said Letters Patent is hereby corrected as shown below:

Column 20,
Line 10, change "range S" to read --range of S--.
Line 11, change "range $Fe^{2+}$" to read --range of $Fe^{2+}$--.
Line 13, change "range S" to read --range of S--.

Column 23,
Line 30, delete first "(d)".

Column 27,
Line 13, change "range $CDmin\geq$" to --a range of $CDmin\leq$--.
Line 32, change " a range" to read --a range of--.
Line 45, change "$0°\leq015°$" to read --$0°\leq0\leq15°$--.
Line 57, delete "$(Ni^{2+})$" and change "$(Ni^{2°})$" to --$(Ni^{2+})$--.

Column 28,
Line 23, change "$IA_{200}=21$" to read --$IA_{220}=21$--.

Claim 7, Column 30,
Line 36 change "by Miller indices)" to read --(by Miller indices)--.
Line 42 change "$d\geq3\mu m$" to read --$d\leq3\mu m$--.

Signed and Sealed this

Third Day of July, 2001

Nicholas P. Godici

Attest:

Attesting Officer

NICHOLAS P. GODICI
Acting Director of the United States Patent and Trademark Office